(12) United States Patent
Zou et al.

(10) Patent No.: US 12,537,482 B2
(45) Date of Patent: Jan. 27, 2026

(54) TRACKING POWER SUPPLIES AND ASSOCIATED SYSTEMS AND METHODS

(71) Applicant: Maxim Integrated Products, Inc., San Jose, CA (US)

(72) Inventors: Gaoling Zou, San Jose, CA (US); Alberto Giovanni Viviani, Mountain View, CA (US); Alexandr Ikriannikov, San Jose, CA (US); Laszlo Lipcsei, Campbell, CA (US)

(73) Assignee: Maxim Integrated Products, Inc., San Jose, CA (US)

(*) Notice: Subject to any disclaimer, the term of this patent is extended or adjusted under 35 U.S.C. 154(b) by 702 days.

(21) Appl. No.: 17/806,540

(22) Filed: Jun. 13, 2022

(65) Prior Publication Data
US 2022/0407466 A1 Dec. 22, 2022

Related U.S. Application Data

(60) Provisional application No. 63/213,034, filed on Jun. 21, 2021.

(51) Int. Cl.
*H03F 1/02* (2006.01)
*H03F 3/21* (2006.01)

(52) U.S. Cl.
CPC ........... *H03F 1/0238* (2013.01); *H03F 3/211* (2013.01); *H03F 2200/105* (2013.01)

(58) Field of Classification Search
CPC .. H03F 1/0238; H03F 3/211; H03F 2200/105; H03F 3/19; H03F 3/245; H03F 2200/451; H03F 1/025; H03F 3/68; H03F 2200/102; H03F 1/0227; H02M 1/08; H02M 1/0012; H02M 1/0025
USPC .................................. 330/297, 127
See application file for complete search history.

(56) References Cited

U.S. PATENT DOCUMENTS

| | | | |
|---|---|---|---|
| 11,223,324 B2 * | 1/2022 | Balteanu | H03F 3/195 |
| 11,855,595 B2 * | 12/2023 | Lyalin | H04B 1/38 |
| 2021/0099135 A1 | 4/2021 | Balteanu et al. | |

* cited by examiner

*Primary Examiner* — Hieu P Nguyen
(74) *Attorney, Agent, or Firm* — DLA Piper LLP (US)

(57) ABSTRACT

A tracking power supply includes a power conversion subsystem and one or more tracking subsystems. The power conversion subsystem is configured to generate N power rails, where N is an integer greater than one. Each tracking subsystem includes a switching network and a controller. The switching network is electrically coupled between each of the N power rails and a tracking power rail of the tracking power supply. The controller is configured to control operation of the switching network according to a tracking signal associated with a load powered by the tracking power supply, such that a voltage at the tracking power rail is one of two or more values, as determined at least partially based on the tracking signal. The controller is further configured to adjust voltage of at least one of the N power rails.

20 Claims, 23 Drawing Sheets

TRACKING POWER SUPPLIES AND ASSOCIATED SYSTEMS AND METHODS

RELATED APPLICATIONS

This application claims benefit of priority to U.S. Provisional Patent Application Ser. No. 63/213,034, filed on Jun. 21, 2021, which is incorporated herein by reference.

BACKGROUND

An electronic device normally requires one or more power supplies to provide electrical power to the device. In some applications, power supply voltage must be constant for proper electronic device operation. For example, a microprocessor may require a tightly regulated power supply voltage to guarantee proper operation of the microprocessor under all anticipated operating conditions. In some other applications, however, it is desirable, or even required, that power supply voltage vary. For example, power supply voltage to an optical communication system light source may need to be varied to modulate amplitude of an optical signal generated by the light source.

DETAILED DESCRIPTION OF THE EMBODIMENTS

One rapidly growing use of power supplies is to power radio frequency (RF) power amplifiers (PAs), such as in wireless communication systems (e.g., cellular wireless communication systems and Wi-Fi wireless communication systems). These power amplifiers are typically configured as linear amplifiers, instead of Class-D amplifiers or other switching amplifiers, due to their need to support high frequencies.

Figure 1A:
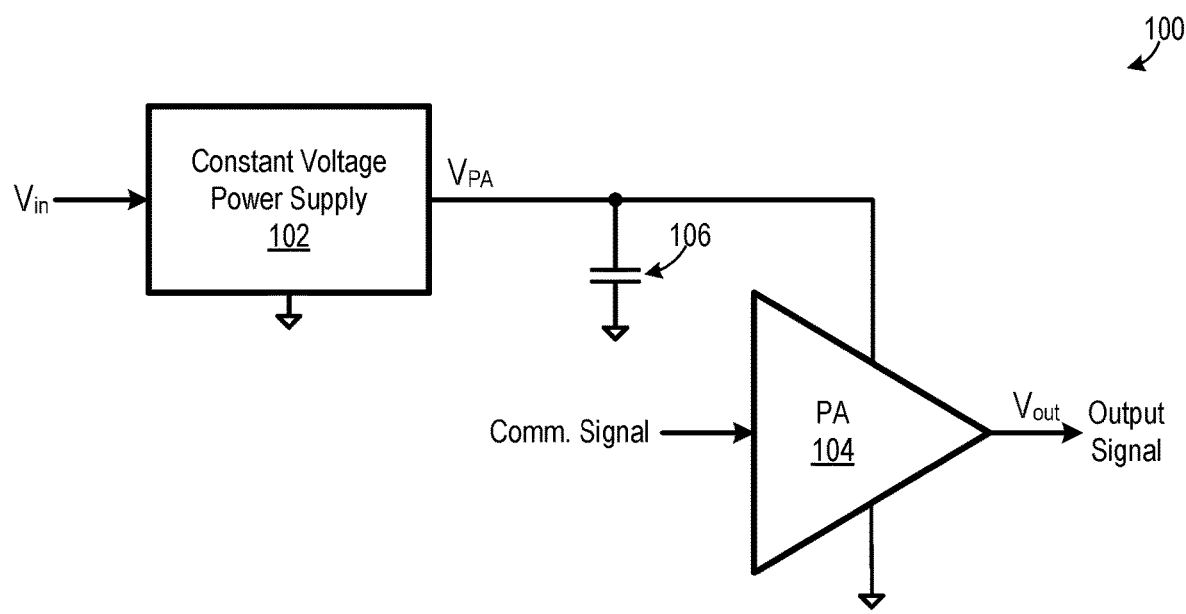
FIG. 1A is a schematic diagram of a system including a constant voltage power supply and a power amplifier.

Power amplifiers can be powered from a constant voltage power supply. For example, FIG. 1A is a schematic diagram of a system 100 including a constant voltage power supply 102, a linear power amplifier 104, and a capacitor 106. Constant voltage power supply 102 converts an input voltage $V_{in}$ to a constant power amplifier supply voltage $V_{PA}$, which is used as an electrical power source for power amplifier 104. Capacitor 106, for example, provides a path for alternating current flowing to power amplifier 104. Capacitor 106 may also be required to ensure stability of a closed loop control system of constant voltage power supply 102. Amplifier 104 amplifies an input communication signal to generate an output signal having a voltage $V_{out}$.

Figure 1B:
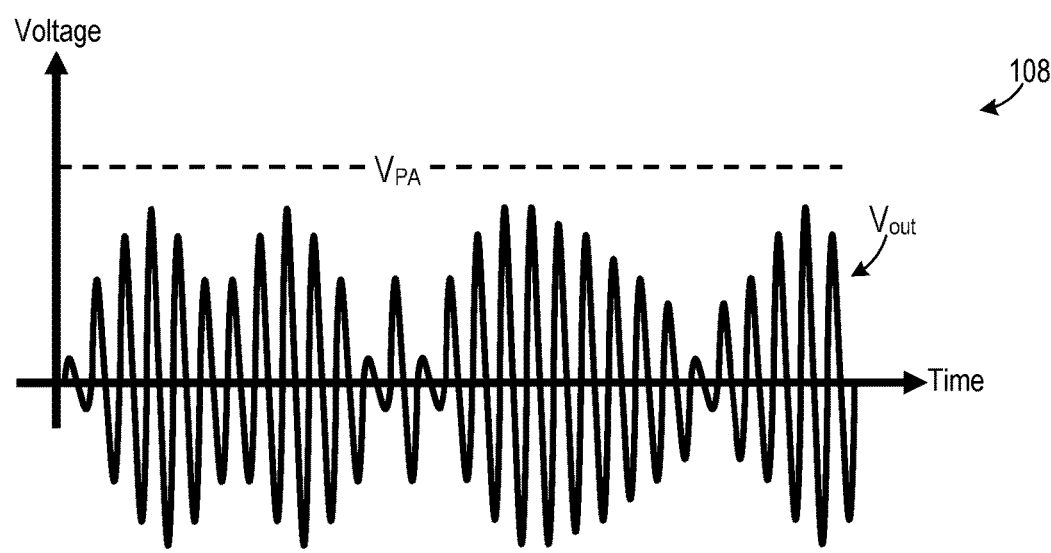
FIG. 1B is a graph of voltage versus time illustrating one example of operation of the FIG. 1A system.

FIG. 1B is a graph 108 of voltage versus time illustrating one example of operation of system 100, and graph 108 includes curves representing voltage $V_{PA}$ and power amplifier 104 output voltage $V_{out}$. Power dissipation in power amplifier PA 104 is proportional to a difference between power amplifier supply voltage $V_{PA}$ and output voltage $V_{out}$. Therefore, power dissipation in power amplifier 104 can be reduced by reducing voltage $V_{PA}$. However, voltage $V_{PA}$ must be sufficiently large to achieve required headroom, i.e., minimum required difference between $V_{PA}$ and $V_{out}$, for proper operation of power amplifier 104, under maximum expected values of output voltage $V_{out}$. Consequently, $V_{PA}$ is significantly greater than required during the majority of power amplifier 104's operating time, as shown in FIG. 1B by voltage $V_{PA}$ generally being significantly greater than $V_{out}$, resulting in significant power dissipation in power amplifier 104.

Figure 2A:
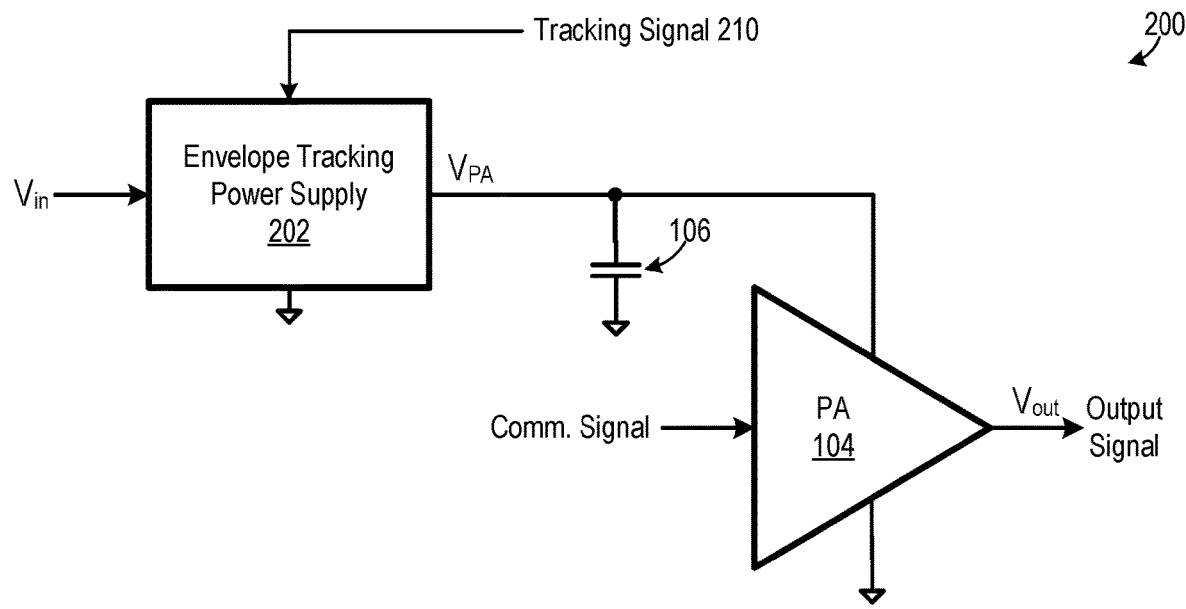
FIG. 2A is a schematic diagram of a system including an envelope tracking power supply and a power amplifier.
Figure 2B:
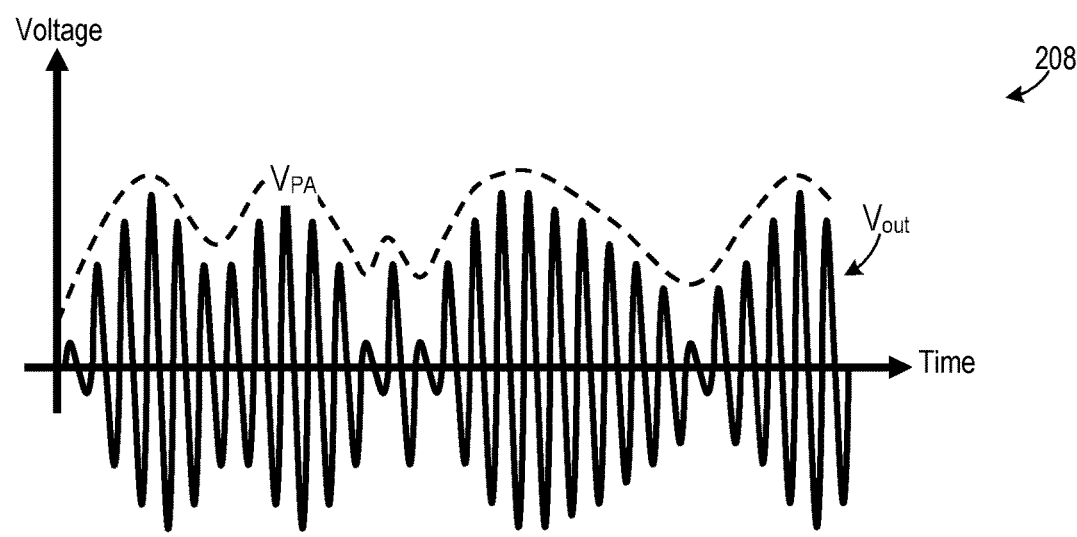
FIG. 2B is a graph of voltage versus time illustrating one example of operation of the FIG. 2A system.

A tracking power supply, which adjusts its output voltage according to the needs of its load, can be used to reduce power dissipation in a power amplifier. For example, FIG. 2A is a schematic diagram of a system 200, which is like system 100 of FIG. 1A, but with constant voltage power supply 102 replaced with an envelope tracking power supply 202. Envelope tracking power supply 202 is configured to adjust magnitude of voltage $V_{PA}$ according to an envelope tracking signal 210, which represents required power supply voltage of power amplifier 104. FIG. 2B is a graph 208 of voltage versus time illustrating one example of operation of system 200, and graph 208 includes curves representing voltages $V_{PA}$ and $V_{out}$. As illustrated in FIG. 2B, power amplifier supply voltage $V_{PA}$ tracks output voltage $V_{out}$ such that power amplifier supply voltage $V_{PA}$ is at a minimum required value to achieve necessary headroom in power amplifier 104, thereby significantly reducing power dissipation in power amplifier 104, compared to the constant voltage configuration of FIG. 1A.

Figure 3A:
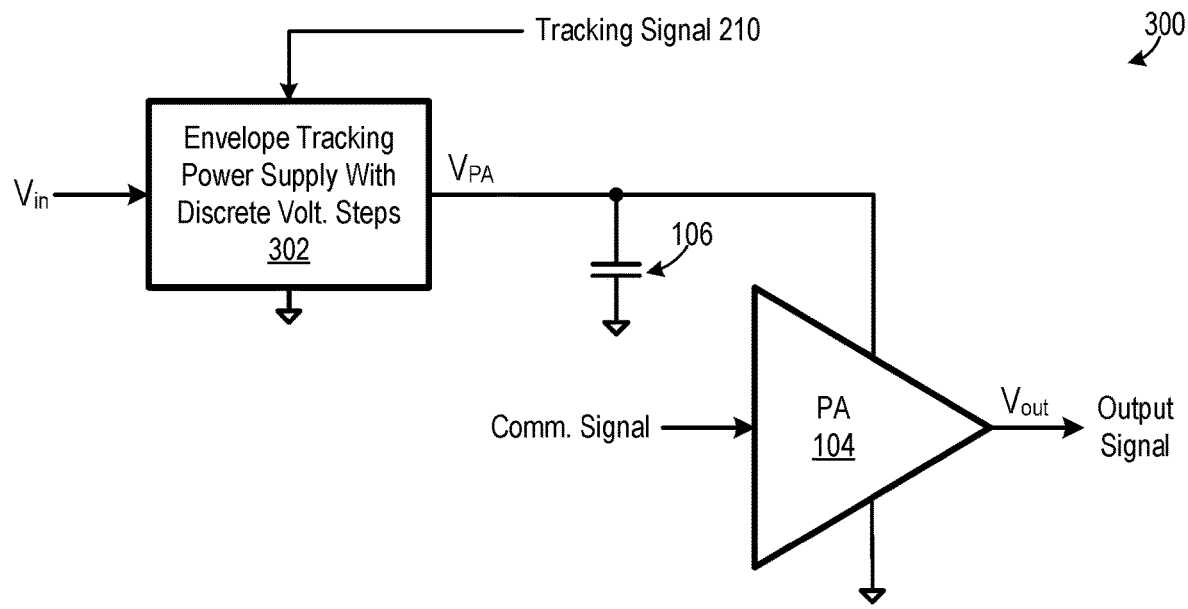
FIG. 3A is a schematic diagram of another system including an envelope tracking power supply and a power amplifier.
Figure 3B:
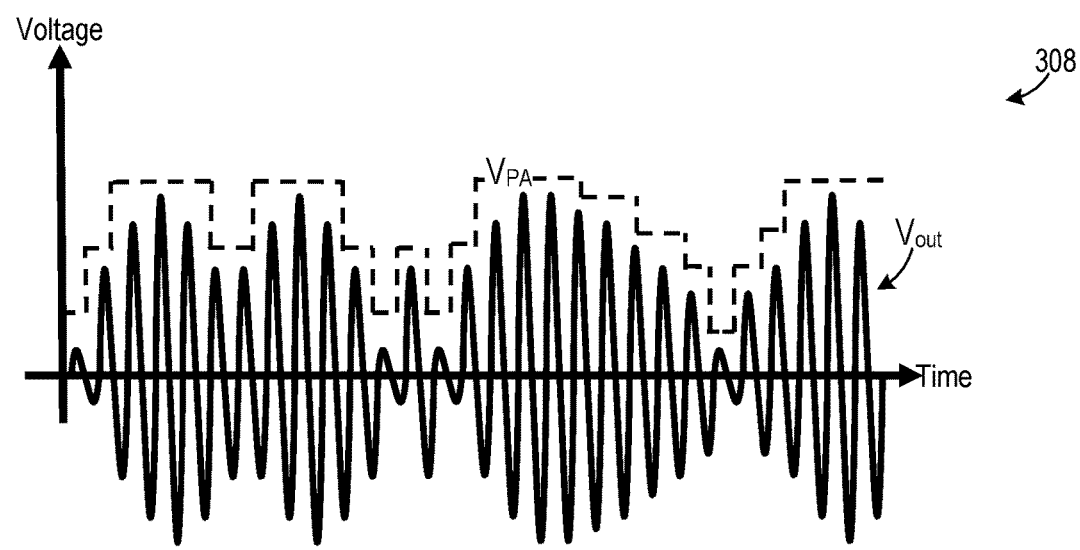
FIG. 3B is a graph of voltage versus time illustrating one example of operation of the FIG. 3A system.

FIG. 3A is a schematic diagram of a system 300, which is like system 200 of FIG. 2A but with envelope tracking power supply 202 replaced with an envelope tracking power supply 302 with discrete voltage steps. FIG. 3B is a graph 308 of voltage versus time illustrating one example of operation of system 300, and graph 308 includes curves representing power amplifier supply voltage $V_{PA}$ and power amplifier 104 output voltage $V_{out}$. As illustrated in FIG. 3B, power amplifier supply voltage $V_{PA}$ changes in discrete steps to approximately track output voltage $V_{out}$, thereby significantly reducing power dissipation in power amplifier 104, compared to the constant voltage configuration of FIG. 1A. Envelope tracking power supply 302 may be simpler to design that envelope tracking power supply 202 of FIG. 2A due to envelope tracking power supply 302 supporting only a limited number of discrete values of output voltage $V_{out}$.

While the envelope tracking power supplies of FIGS. 2A and 3A can significantly reduce power dissipation in power amplifier 104, these tracking power supplies can be difficult to implement in practice, due to the need for power amplifier supply voltage $V_{PA}$ to change very quickly in response to tracking signal 210. For example, power supply inductance limits rate of current change, and power supply capacitance limits rate of voltage change. Consequently, inductance and capacitance of tracking power supplies 202 and 302 limits ability of the tracking power supplies to quickly change power amplifier supply voltage $V_{PA}$ in response to tracking signal 210. Additionally, it may be difficult to design tracking power supplies 202 and 302 to have sufficient control loop bandwidth to quickly respond to changes in tracking signal 210.

Disclosed herein are new tracking power supplies and associated methods which at least partially overcome the drawbacks of the tracking power supplies of FIGS. 2A and 3A. The new tracking power supplies include a power conversion subsystem and a tracking subsystem. The power conversion subsystem generates a plurality of power rails, and the tracking subsystem includes a switching network which selectively connects one or more of the power supply rails to a load in response to a tracking signal. Power supply voltage to the load is varied primarily by changing operating state of the tracking subsystem, instead of by changing operating state of the power conversion subsystem. Therefore, load voltage can be quickly changed irrespective of whether the power conversion subsystem is capable of quickly changing voltage of its power rails. As a result, the power conversion subsystem need not be designed for fast response, thereby potentially simplifying tracking power supply design, increasing tracking power supply robustness, and decreasing tracking power supply cost.

Figure 4:
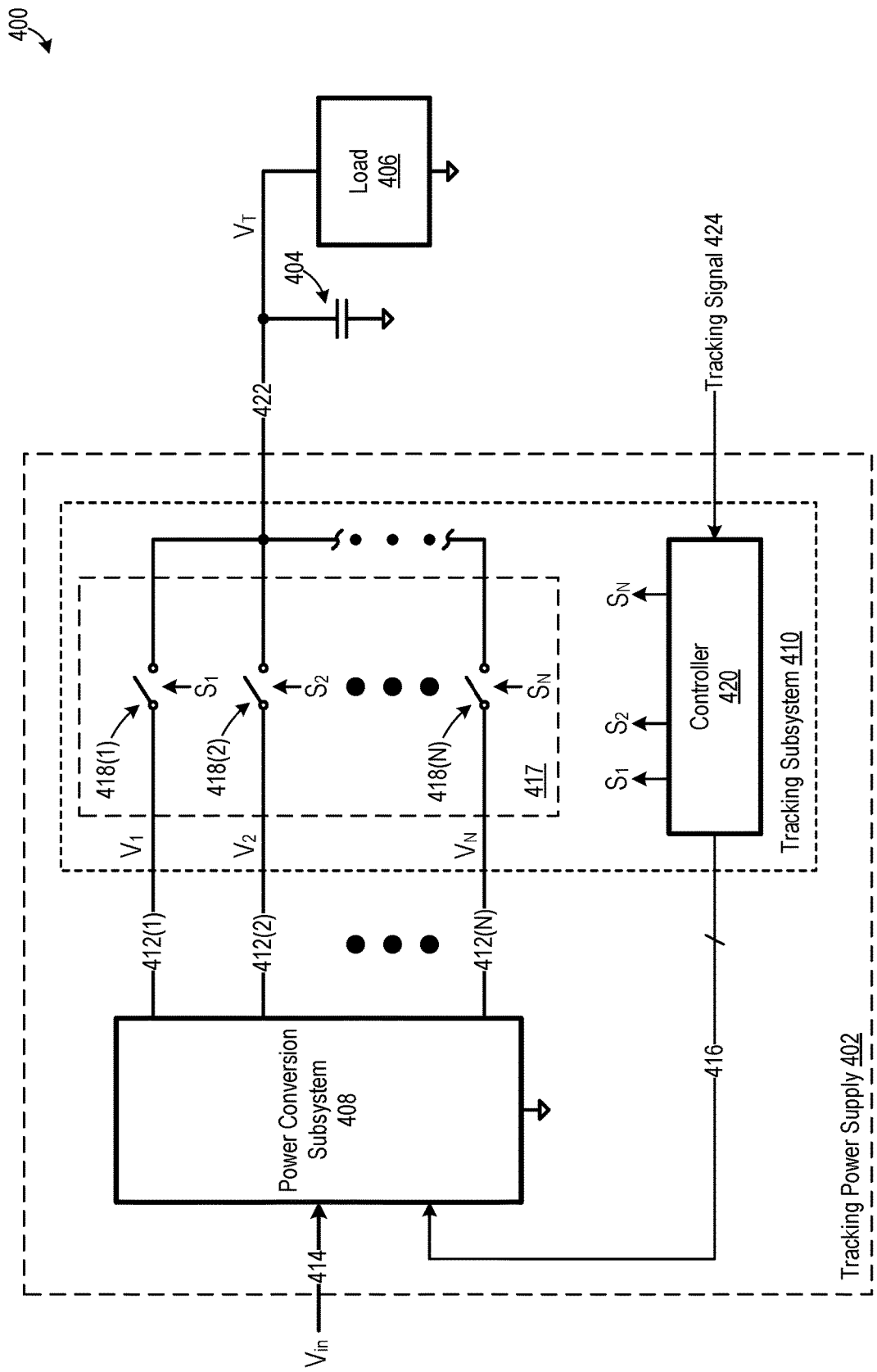
FIG. 4 is a schematic diagram of a system including a tracking power supply, according to an embodiment.

FIG. 4 is a schematic diagram of a system 400 including a tracking power supply 402, a capacitor 404, and a load 406. Tracking power supply 402 is one embodiment of the new tracking power supplies disclose herein, and tracking power supply 402 includes a power conversion subsystem 408 and a tracking subsystem 410. Power conversion subsystem 408 is configured to generate a N power rails 412 from an input power rail 414, where N is an integer greater than one. In this document, specific instances of an item may be referred to by use of a numeral in parentheses (e.g. power rail 412(1)) while numerals without parentheses refer to any such item (e.g. power rails 412). In some alternate embodiments, power conversion subsystem 408 is configured to generate power rails 412 from two or more input power rails (not shown), instead of from single input power rail 414.

Input power rail 414 has a voltage $V_{in}$, and each power rail 412 has a respective voltage $V_k$, where k is an index ranging from one to N which identifies the power rail. For example, power rail 412(1) has a voltage $V_1$, power rail 412(2) has a voltage $V_2$, and so on. In some embodiments, each power rail 412 has a different respective voltage $V_k$, such as to maximize a number of possible different power supply voltages which may be provided to load 406. In some other embodiments, two more or more power rails 412 may have a common voltage $V_k$, such as to enable power sharing by the power rails having a common voltage.

In certain embodiments, power conversion subsystem 408 is configured such that respective voltages $V_k$ of power rails 412 are fixed. In certain other embodiments, power conversion subsystem 408 is configured such that one or more voltages $V_k$ of power rails 412 may be changed in response to a voltage control signal 416, such as to help optimize voltages $V_k$ for load 406, as discussed below. Voltage control signal 416 may be generated by tracking subsystem 410, or voltage control signal 416 may be generated external to tracking power supply 402. Voltage control signal 416 is optionally omitted in embodiments of tracking power supply 402 where power conversion subsystem 408 is configured such that respective voltages $V_k$ of power rails 412 are fixed.

Figure 5:
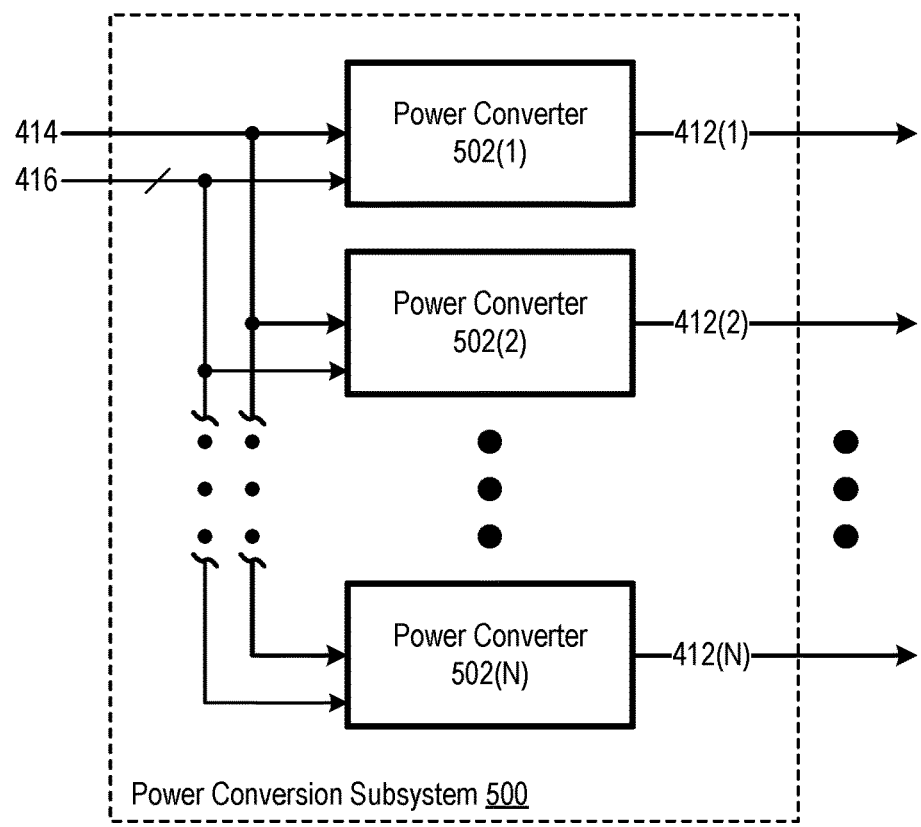
FIG. 5 is a block diagram of one possible embodiment of a power conversion subsystem of the FIG. 4 tracking power supply.

In some embodiments, power conversion subsystem 408 includes a plurality of power converters, such as a respective power converter for each power rail 412. For example, FIG. 5 is a block diagram of a power conversion subsystem 500, which is one possible embodiment of power conversion subsystem 408. Power conversion subsystem 500 includes N power converters 502, where each power converter 502 is configured to generate a respective one of the N power rails 412 from input power rail 414. Each power converter 502 can have essentially any configuration, such as switching or linear, or isolated or non-isolated, as long as it is capable of generating its respective power rail 412. FIG. 5 illustrates each power converter 502 being capable of receiving voltage control signal 416 to change its respective output voltage $V_k$. However, in some alternate embodiments, power converters 502 are configured to generate a fixed voltage $V_k$ and voltage control signal 416 is omitted.

Power conversion subsystem 500 could be modified as long as it is capable of generating power rails 412. For example, power conversion subsystem 500 could be modified so that each power converter 502 is powered from a different input power rail (not shown), instead of from common input power rail 414. As another example, in embodiments of tracking power supply 402 where N is an even integer, power conversion subsystem 500 could be modified to include N/2 power converters, where each power converter generates a respective two power rails 412 of the N power rails. As yet another example, power converters 502 could be replaced with or supplemented by other devices, such as batteries, which are capable of generating power rails 412.

Figure 6:
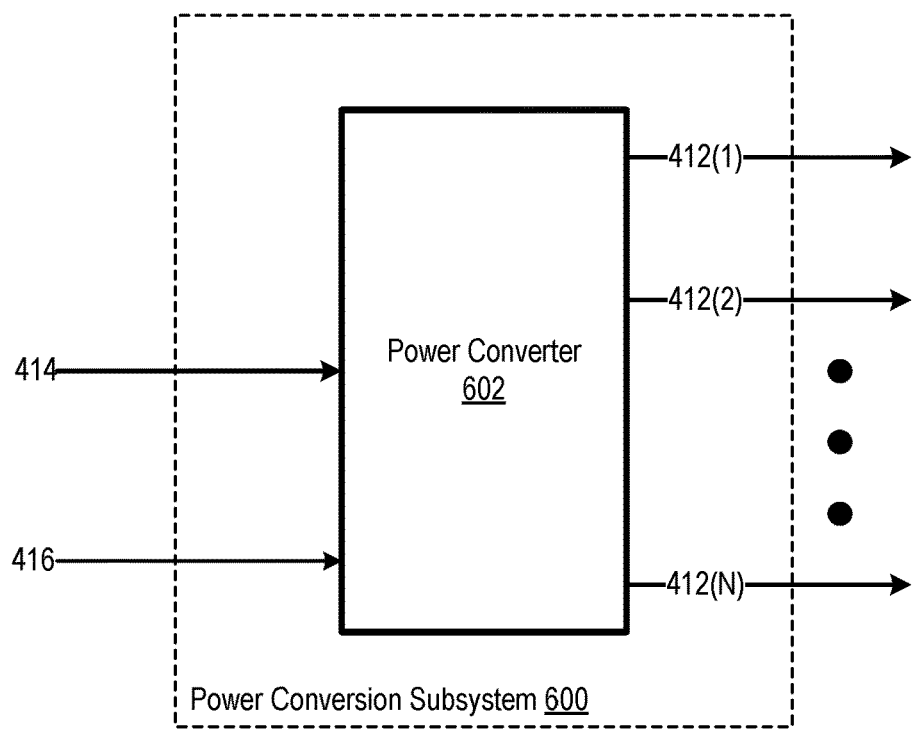
FIG. 6 is a block diagram of another possible embodiment of a power conversion subsystem of the FIG. 4 tracking power supply.

FIG. 6 is a block diagram of a power conversion subsystem 600, which is another possible embodiment of power conversion subsystem 408. Power conversion subsystem 600 includes a single power converter 602 configured to generate all N power rails 412 from input power rail 414. In some embodiments, power converter 602 includes a coupled inductor (not shown) and/or a transformer (not shown) to realize multiple power rails 412 from single input power rail 414. Additionally, in certain embodiments, power converter 602 is configured to transfer electric power between two or more power rails 412, such as by using a coupled inductor (not shown), a transformer (not shown), and/or a switched-capacitor network (not shown). Power converter 602 is optionally configured to change voltages $V_k$ of one or more power rails 412 in response to voltage control signal 416.

Referring again to FIG. 4, tracking subsystem 410 includes a switching network 417 and a controller 420. Switching network 417 includes N switching devices 418, and each switching device 418 is electrically coupled between a respective power rail 412 and a common tracking power rail 422. Load 406 is also electrically coupled to tracking power rail 422, such that load 406 is at least partially powered from tracking power rail 422. Switching devices 418 are configured such that their operating states may change over time. Specifically, each switching device 418 is controlled by a respective switching signal $S_k$, where k is an index ranging from one to N which identifies the switching device. For example, switching device 418(1) is controlled by switching signal $S_1$, switching device 418(2) is controlled by switching signal $S_2$, and so on. In some embodiments, each switching device 418 includes one or more transistors, such as a field effect transistor (FET), a bipolar junction transistor (BJT), or an insulated gate bipolar transistor (IGBT). In some embodiments, one or more switching devices 418 include two or more transistors electrically coupled in series, such as to prevent undesired current flow through a transistor's parasitic diode. Additionally, in particular embodiments, one or more switching devices 418 include two or more transistors electrically coupled in parallel, such as to achieve high current capability. Furthermore, one or more switching devices 418 may include a device other than a transistor, such as a diode to prevent undesired reverse current flow. Switching network 417 may have a different configuration, such as discussed below with respect to FIG. 20, as long as switching network 417 is capable to selectively connecting one or more power rails 412 to tracking power rail 422 in response to one or more switching signals $S_k$.

Controller 420 is configured to control operation of switching devices 418 according to a tracking signal 424, such that a voltage $V_T$ at tracking power rail 422 is one of power rail 412 voltages $V_k$. In particular, controller 420 is configured to generate switching signals $S_k$ so that at a given time one switching device 418 is closed (in its conductive state) and the remaining switches devices 418 are open (in their non-conductive states), based on tracking signal 424. Accordingly, switching network 417 is configured to selectively connect load 406 to a power rail 412 according to tracking signal 424.

In particular embodiments, tracking signal 424 is associated with load 406. For example, in some embodiments, tracking signal 424 represents power supply voltage required by load 406, and controller 420 is configured to (a) select one voltage $V_k$ of all voltages $V_k$ which best meets the power supply voltage requirement of load 406 and (b) generate switching signals $S_k$ such that (1) the switching device 418 associated with the power rail 412 having the selected voltage $V_k$ is closed and (2) the remaining switching devices 418 are open. Stated differently, controller 420 is configured to control switching network 417 via control signals $S_k$ in response to tracking signal 424, such that the power rail 412 having the selected voltage $V_k$ is connected to tracking power rail 422 and the remaining power rails 412 are not connected to tracking power rail 422.

For example, Table 1 below shows one possible operating scenario of an embodiment of tracking power supply 402 where N is equal to four. Table 1 includes a respective column for values of each of tracking signal 424, switching signal $S_1$, switching signal $S_2$, switching signal $S_3$, switching signal $S_4$, and tracking power rail 422 voltage $V_T$. Logic states of switching signals $S_k$ in Table 1 are represented by the numbers zero and one, where zero represents logic low and one represents logic high. In this example operating scenario, a switching device 418 is open when its switching signal $S_k$ is logic low, and the switching device 418 is closed when its switching signal $S_k$ is logic high. For example, switching device 418(1) is open when its switching signal $S_1$ is logic low, and switching device 418(1) is closed when its switching signal $S_1$ is logic high.

However, switching signals $S_k$ could have a different polarity from those of Table 1 without departing from the scope hereof. For example, tracking subsystem 410 could be configured such that a switching device 418 is closed when its switching signal $S_k$ is logic low and the switching device 418 is open when its switching signal $S_k$ is logic high. Additionally, tracking subsystem 410 could be configured so that switching signals $S_k$ are non-binary digital signals or even analog signals.

In the Table 1 example operating scenario, tracking signal 424 has one of four different values, or ranges of values, represented by letters A, B, C, or D, respectively. In the Table 1 operating scenario, controller 420 generates switching signals $S_k$ such that switching signal $S_1$ is logic high and the remaining switching signals $S_k$ are logic low, in response to tracking signal 424 having a value of A, such that tracking power rail voltage $V_T$ is equal to $V_1$. In response to tracking signal having a value B, controller 420 generates switching signals $S_k$ such that switching signal $S_2$ is logic high and the remaining switching signals $S_k$ are logic low, such that tracking power rail voltage $V_T$ is equal to $V_2$. Controller 420 generates switching signals $S_k$ such that switching signal $S_3$ is logic high and the remaining switching signals $S_k$ are logic low, in response to tracking signal 424 having a value of C, such that tracking power rail voltage $V_T$ is equal to $V_3$. Finally, in response to tracking signal having a value D, controller 420 generates switching signals $S_k$ such that switching signal $S_4$ is logic high and the remaining switching signals $S_k$ are logic low, such that tracking power rail voltage $V_T$ is equal to $V_4$.

TABLE 1

| Tracking Signal 424 | Switching Signal $S_1$ | Switching Signal $S_2$ | Switching Signal $S_3$ | Switching Signal $S_4$ | $V_T$ |
|---|---|---|---|---|---|
| A | 1 | 0 | 0 | 0 | $V_1$ |
| B | 0 | 1 | 0 | 0 | $V_2$ |
| C | 0 | 0 | 1 | 0 | $V_3$ |
| D | 0 | 0 | 0 | 1 | $V_4$ |

It should be appreciated that switching devices 418 can change state quickly in response to a change in switching signals $S_k$, thereby causing tracking power rail voltage $V_T$ to quickly change. Consequently, controller 420 can cause tracking power rail voltage $V_T$ to quickly change in response to a change in tracking signal 424, and it is therefore unnecessary for power conversion subsystem 408 to quickly change voltages $V_k$ of power rails 412. Indeed, in some embodiments, power rail 412 voltages $V_k$ are fixed, as discussed above. While capacitor 404 may slow change in voltage $V_T$, capacitor 404 may be required for stability and/or to maintain voltage $V_T$ during change in operating state of switching devices 418. For example, in some embodiments, controller 420 is configured to generate switching signals $S_k$ so that switching devices 418 switch in a break before make manner, i.e., all switching device 418 open before any switching device 418 closes, to prevent shorting of two or more power rails 412. In these embodiments, capacitor 404 may provide power to load 406 while all switching devices 418 are open. The value of capacitor 404 may be selected to be a minimum value required for proper tracking power supply 402 operation, and capacitor 404 may be omitted without departing from the scope hereof.

Tracking signal 424 is, for example, generated by load 406 or a system or circuitry associated with load 406. As noted above, in some embodiments, tracking signal 424 represents power supply voltage requirements of load 406. For example, in embodiments where load 406 includes a power amplifier, such as discussed below with respect to FIG. 11, tracking signal 424 may represent an envelope of power supply voltage required by the power amplifier. However, tracking signal 424 could have a different association with load 406. For example, tracking signal 424 could be generated based on temperature of load 406, such as to achieve maximum performance of load 406 while preventing load 406 from overheating. Although FIG. 4 illustrates tracking signal 424 as originating from outside of tracking power supply 402, tracking power supply 402 could be modified to internally generate tracking signal 424.

While controller 420 is depicted in FIG. 4 as a single element, controller 420 may include multiple constituent elements (not shown in FIG. 4) which need not be co-packaged or even disposed at a single location. Additionally, some elements of controller 420 may be outside of tracking subsystem 410 or even outside of tracking power supply 402. Although controller 420 is illustrated as being separate from the remaining elements of tracking power supply 402, controller 420 may be partially or fully integrated with one or more elements of tracking power supply 402. Connections between controller 420 and switching devices 418 are not shown in FIG. 4 for illustrative clarity. In some embodiments, each switching signal $S_k$ is carried to its respective switching device 418 via a dedicated communication bus (not shown), while in some other embodiments, two or more switching signals $S_k$ are carried to switching devices 418 via a common communication bus (not shown).

Discussed below with respect to FIGS. 7-10 are several example embodiments of controller 420. However, it is understood that controller 420 is not limited to these example embodiments. In the embodiments of FIGS. 7-10, controller elements may be implemented, for example, by analog electronic circuitry and/or digital electronic circuitry. Additionally, two or more of elements of the controllers could be combined without departing from the scope hereof. Furthermore, in some embodiments, some or all of the elements of the controllers of FIGS. 7-10 are at least partially implemented by a processor (not shown) executing instructions in the form of software and/or firmware stored in a memory (not shown).

Figure 7:
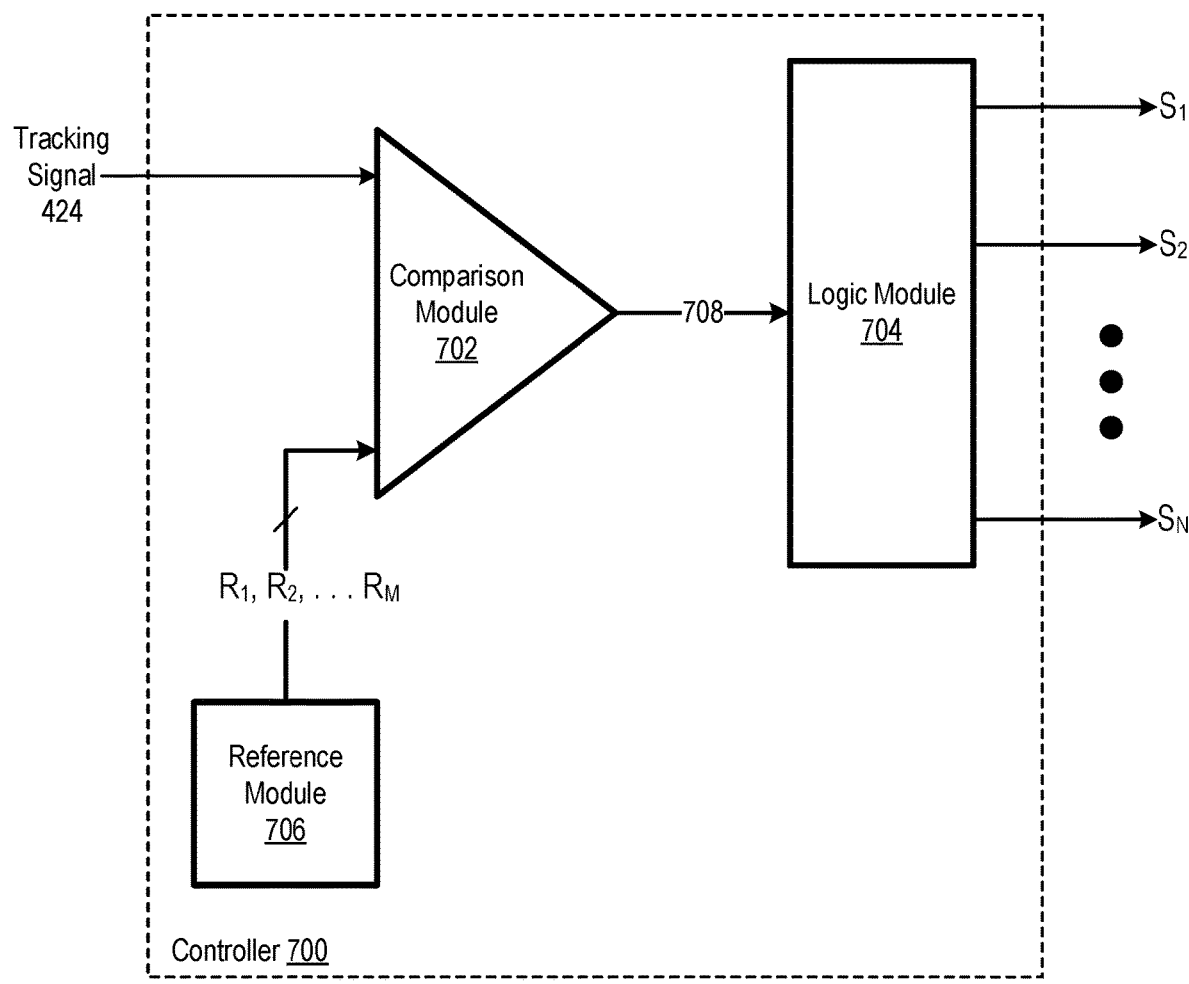
FIG. 7 is a block diagram of one possible embodiment of a controller of the FIG. 4 tracking power supply.

FIG. 7 is a block diagram of a controller 700, which is one possible embodiment of controller 420 of FIG. 4. Controller 700 includes a comparison module 702, a logic module 704, and a reference module 706. Reference module 706 is configured to generate M reference values $R_j$, where M is an integer greater than one and j is an index ranging from one to M. The value of M is implementation dependent and depends, for example, on the number of power rails 412 of tracking power supply 402. Comparison module 702 is configured to compare tracking signal 424 to the M reference values and generate a comparison signal 708 representing a relationship between tracking signal 424 and at least one of reference values $R_j$. For example, comparison signal 708 may indicate that tracking signal 424 is greater than or less than one or more of reference values $R_j$. As another example, comparison signal 708 may indicate that tracking signal 424 is between two reference values $R_j$. Logic module 704 is configured to generate switching signals $S_k$ in response to comparison signal 708, such that the state of switching signals $S_k$ depends on a relationship between tracking signal 424 and reference values $R_j$.

Table 2 below describes operation of one example embodiment of controller 700 where N is equal to five and M is equal to four. However, controller 700 is not limited to the example operation described in Table 2. Table 2 includes a column representing the comparison performed by comparison module 702, as well as the value of each switching signal $S_k$ in response to the comparison. A switching signal $S_k$ value of zero represents logic low, and a switching signal $S_k$ value of one represents logic high, in Table 2. "TS" in Table 2 represents the value of tracking signal 424.

TABLE 2

| Comparison | $S_1$ | $S_2$ | $S_3$ | $S_4$ | $S_5$ |
|---|---|---|---|---|---|
| TS > $R_1$ | 1 | 0 | 0 | 0 | 0 |
| $R_1 \leq$ TS < $R_2$ | 0 | 1 | 0 | 0 | 0 |
| $R_2 \leq$ TS < $R_3$ | 0 | 0 | 1 | 0 | 0 |
| $R_3 \leq$ TS < $R_4$ | 0 | 0 | 0 | 1 | 0 |
| $R_4 \leq$ TS | 0 | 0 | 0 | 0 | 1 |

In the example of Table 2, switching signal $S_1$ is logic high and the remaining switching signals $S_k$ are logic low, resulting in tracking power rail voltage $V_T$ being equal to $V_1$, in response to tracking signal 424 having a value less than $R_1$. In response to tracking signal 424 being greater than or equal to $R_1$ but less than $R_2$, switching signal $S_2$ is logic high and the remaining switching signals $S_k$ are logic low, resulting in tracking power rail voltage $V_T$ being equal to $V_2$. In response to tracking signal 424 being greater than or equal to $R_2$ but less than $R_3$, switching signal $S_3$ is logic high and the remaining switching signals $S_k$ are logic low, resulting in tracking power rail voltage $V_T$ being equal to $V_3$. In response to tracking signal 424 being greater than or equal to $R_3$ but less than $R_4$, switching signal $S_4$ is logic high and the remaining switching signals $S_k$ are logic low, resulting in tracking power rail voltage $V_T$ being equal to $V_4$. Finally, in response to tracking signal 424 being greater than or equal to $R_4$, switching signal $S_5$ is logic high and the remaining switching signals $S_k$ are logic low, resulting in tracking power rail voltage $V_T$ being equal to $V_5$.

Figure 8:
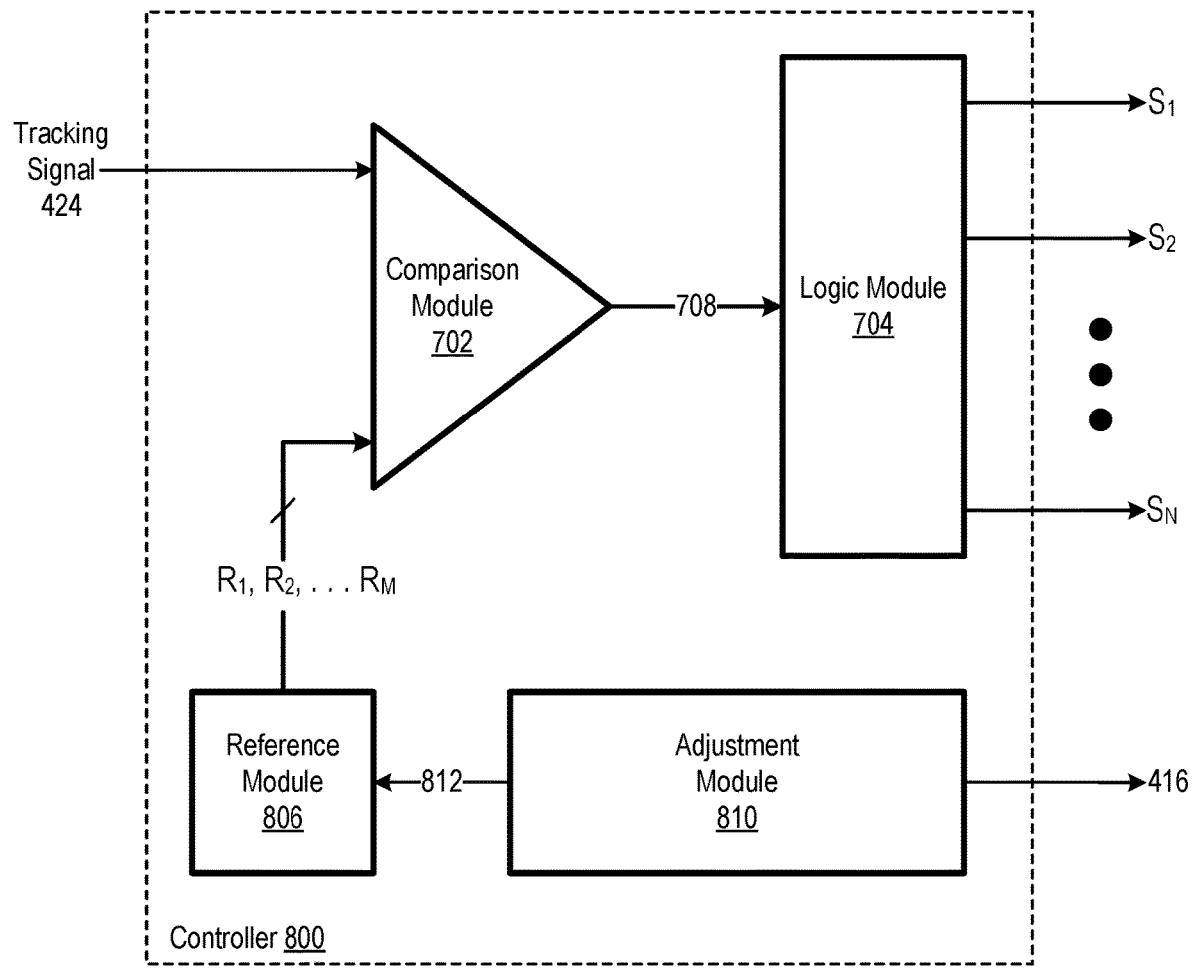
FIG. 8 is a block diagram of an alternate embodiment of the FIG. 7 controller.

Controller 700 could be modified to omit reference module 706 and receive reference values $R_j$ from a source external to controller 700, or even from a source external to tracking power supply 402. Furthermore, controller 700 could be modified so that one or more of reference values $R_j$ are adjustable. For example, FIG. 8 is a block diagram of a controller 800, which is an alternate embodiment of controller 700 which further includes an adjustment module 810. Additionally, reference module 706 is replaced with a reference module 806. Adjustment module 810 is configured to generate an adjustment signal 812, and reference module 806 is configured to adjust one or more of reference values $R_j$ in response to adjustment signal 812. Adjustment module 810 is also configured to generate voltage control signal 416, such that adjustment module 810 can cause adjustment of both voltage rail 412 voltages $V_k$ and reference values $R_j$. For example, adjustment module 810 may generate voltage control signal 416 to increase voltage rail 412(2) voltage $V_2$ by ten percent, and adjustment module 810 may generate adjustment signal 812 to also increase reference value $R_2$ by ten percent, so that voltage rail 412 voltages $V_k$ and reference values $R_j$ are synchronized.

In some embodiments, adjustment module 810 is configured to adjust voltages $V_k$ and reference values $R_j$ in response to a user command, such as during initial commissioning of system 400 or due to a change in configuration of system 400. In some other embodiments, adjustment module 810 is configured to automatically adjust voltages $V_k$ and reference values $R_j$. For example, adjustment module 810 may be configured to automatically adjust voltages $V_k$ and reference values $R_j$ based one or more predetermined criteria, such as time of day or operating status of load 406. As another example, adjustment module 810 may be configured to use machine learning or artificial intelligence to automatically adjust voltages $V_k$ and reference values $R_j$, such as to help achieve optimal operation of system 400 in view of the system's operating history.

Figure 9:
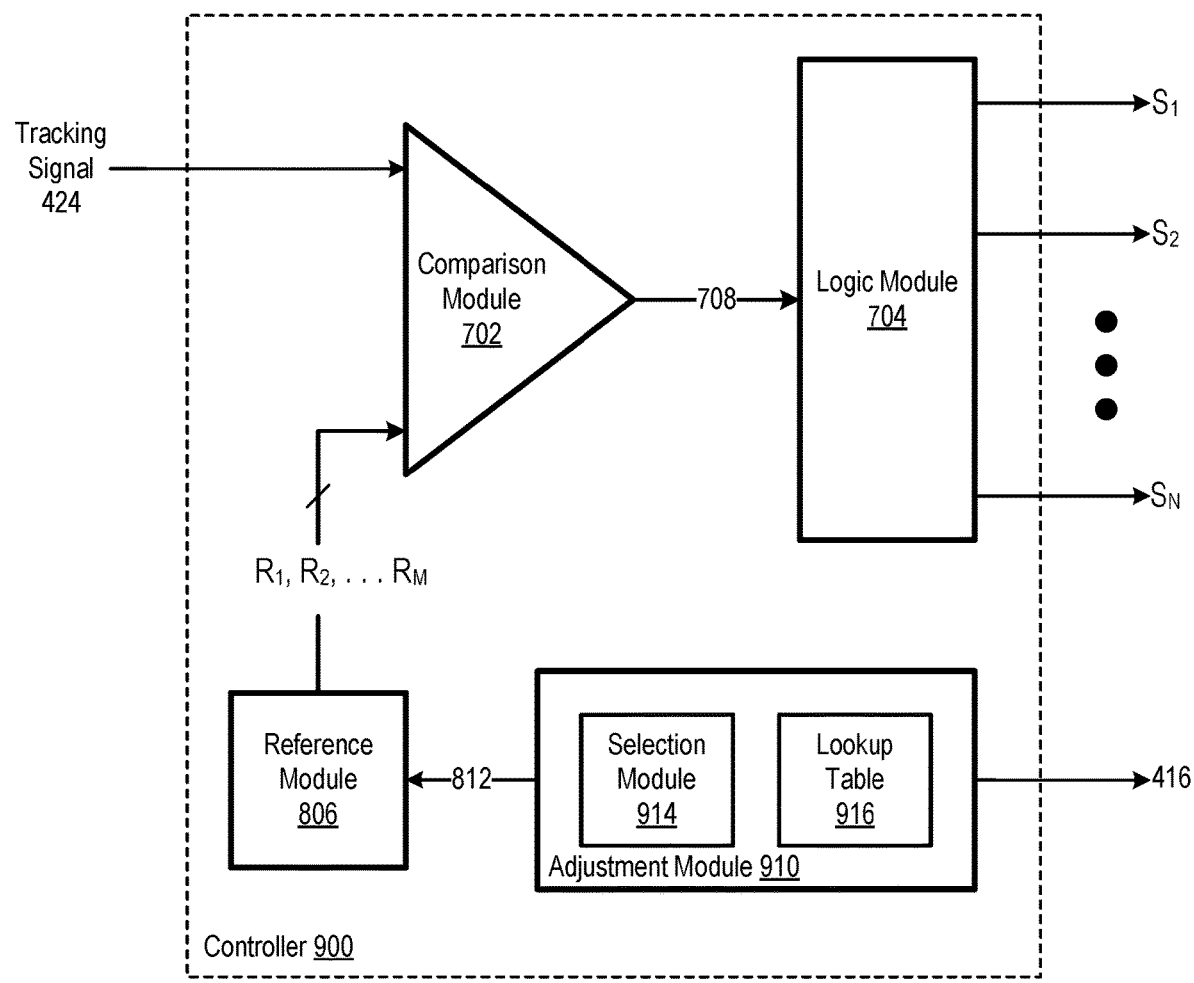
FIG. 9 is a block diagram of one embodiment of the FIG. 8 controller including a selection module and a lookup table.
Figure 10:
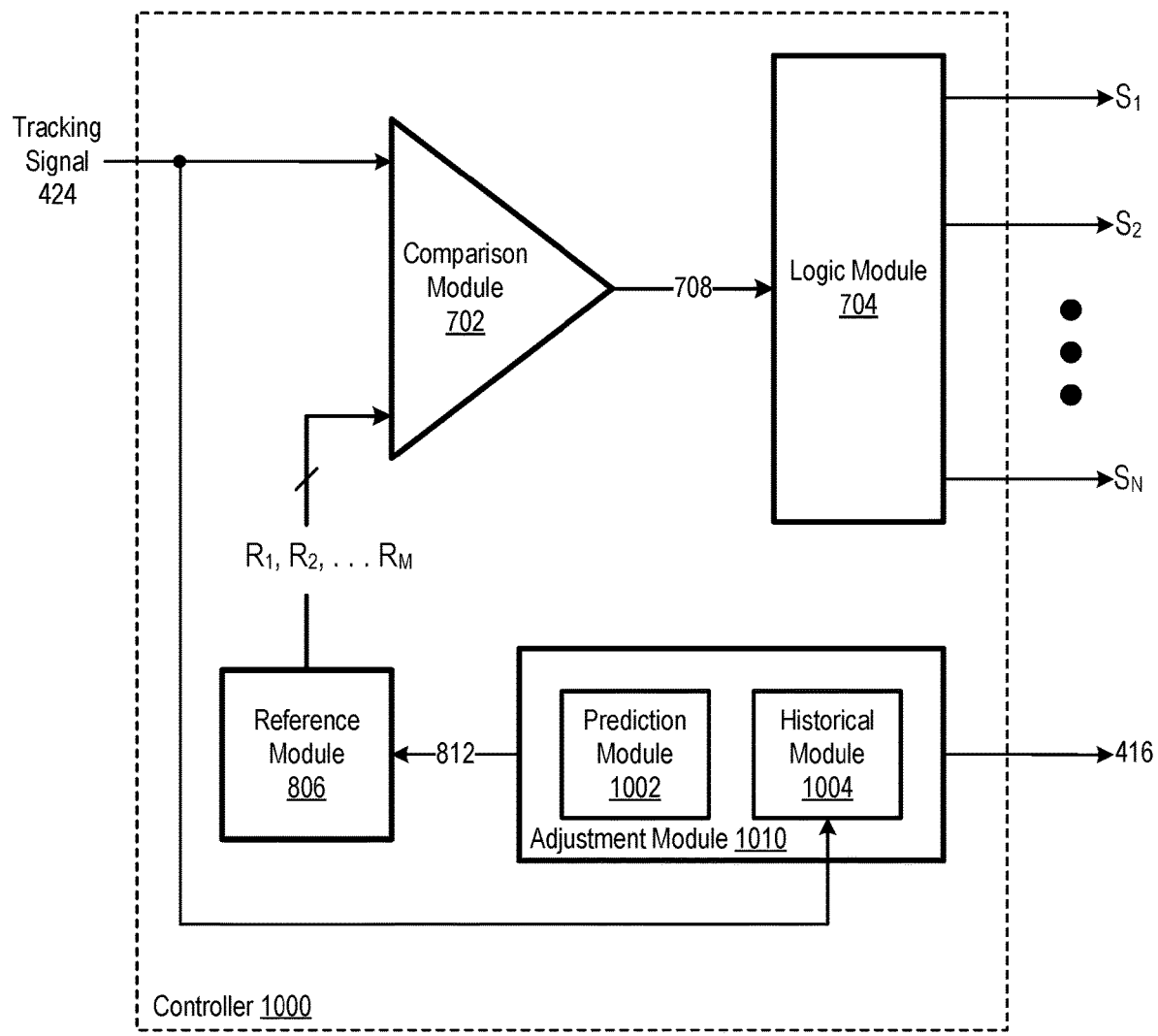
FIG. 10 is a block diagram of one embodiment of the FIG. 8 controller including a prediction module and a historical module.

FIGS. 9 and 10 illustrate two specific configurations of adjustment module 810, although adjustment module 810 is not limited to these two configurations. FIG. 9 is a block diagram of a controller 900 where adjustment module 810 is embodied by an adjustment module 910 including a selection module 914 and a lookup table 916. Lookup table 916 includes a plurality of possible values of voltage rail 412 voltages $V_k$ and reference values $R_j$. Selection module 914 is configured to select appropriate voltages $V_k$ and reference values $R_j$ based on one or more predetermined criteria, and selection module 914 is configured to generate voltage control signal 416 and adjustment signal 812 to achieve the selected voltages $V_k$ and reference values $R_j$. Examples of the predetermined criteria include, but are not limited to, time of day, environmental conditions, operating status of load 406, configuration of load 406, and availability of energy to power system 400.

FIG. 10 is a block diagram of a controller 1000, where adjustment module 810 is embodied by an adjustment module 1010 including a prediction module 1002 and a historical module 1004. Historical module 1004 includes operating history of one or more aspects of load 406. For example, historical module 1004 may include a table of historical operating conditions of load 406 and corresponding power supply voltage requirements of load 406 for each historical operating condition. Prediction module 1002 is configured to predict required voltage of load 406 based on current operating conditions of load 406 in view of information in historical module 1004. For example, prediction module 1002 may identify a historical operating condition of load 406 that is closest to a current operating condition of load 406, and prediction module 1002 may set power rail 412 voltages $V_k$ to voltages corresponding to the identified historical operating condition, as stored in historical module 1004. In some embodiments, adjustment module 1010 is configured to update historical module 1004 on a regular basis or even continuously to include additional information on load 406's operation, such as based on values of tracking signal 424, so that adjustment module 1010 "learns" over time.

Figure 11:
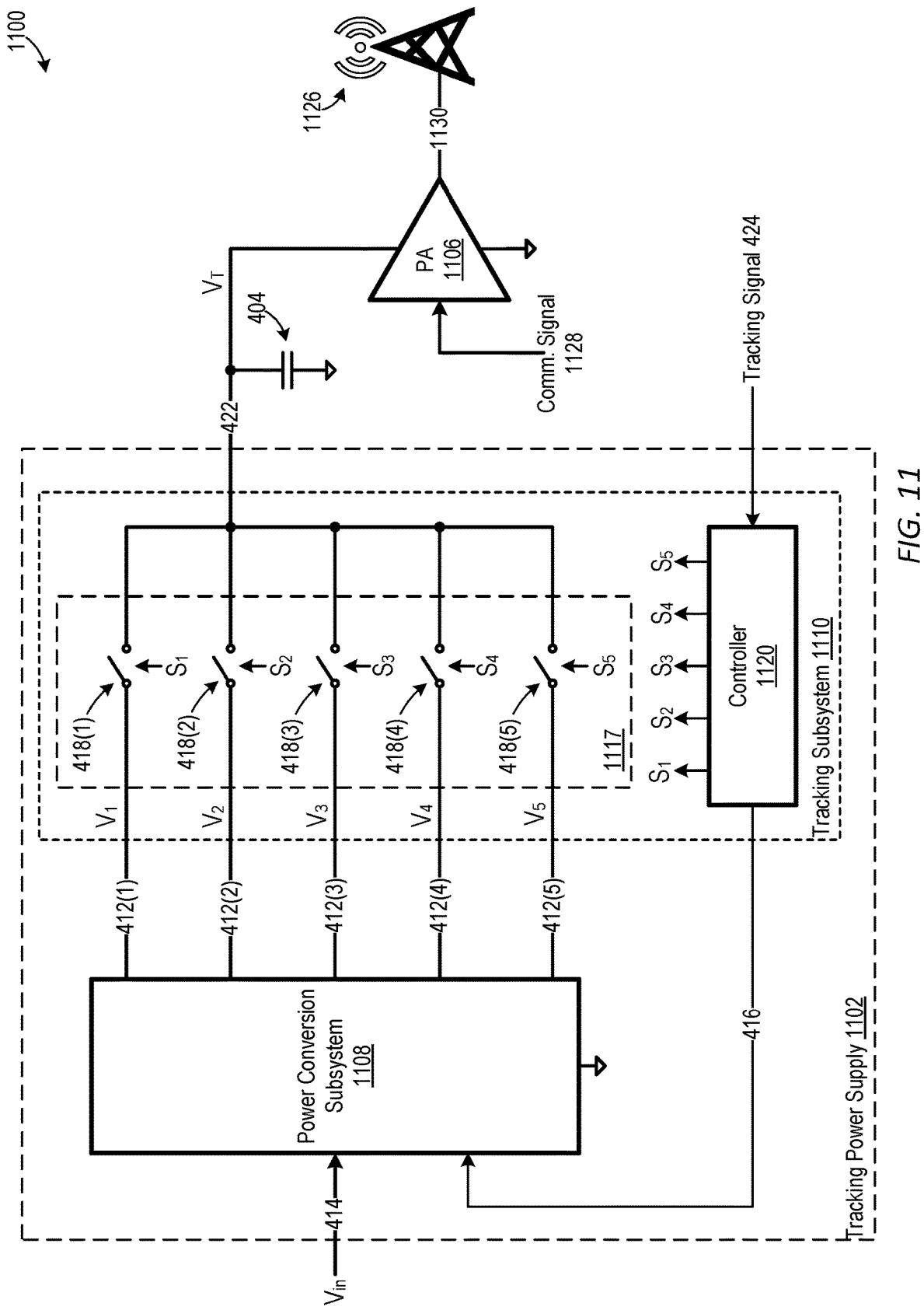
FIG. 11 is a block diagram of an embodiment of the FIG. 4 system including a power amplifier powered by a tracking power supply.

Referring again to FIG. 4, load 406 includes one or more elements that are powered from tracking power rail 422. For example, FIG. 11 is a schematic diagram of a system 1100, which is an embodiment of system 400 of FIG. 4 where (a) load 406 is embodied by a power amplifier 1106 communicatively coupled to an antenna 1126, (b) tracking power supply 402 is embodied by a tracking power supply 1102 where N is equal to five, (c) power conversion subsystem 408 is embodied by a power conversion subsystem 1108 generating five power rails 412, (d) tracking subsystem 410 is embodied by a tracking subsystem 1110, (e) switching network 417 is embodied by a switching network 1117 including five instances of switching devices 418, and (f) controller 420 is embodied by a controller 1120 generating switching signals $S_1$ through $S_5$. Power amplifier 1106, which is at least partially powered from tracking power rail 422, is configured to amplify a communication signal 1128 to generate an amplified signal 1130 which drives antenna 1126. In some embodiments, power amplifier 1106 and antenna 1126 are part of one or more of (a) a fourth generation (4G) cellular wireless communication system, such as a long term evolution (LTE) wireless communication system, (b) a fifth generation (5G) new radio (NR) cellular wireless communication system, (c) a sixth generation (6G) cellular wireless communication system, (d) a Wi-Fi wireless communication system, (e) a Bluetooth wireless communication system, (f) a long range (LoRa) wireless communication system, (g) a Zigbee wireless communication system, and (h) extensions, modifications, and successors of any of the foregoing communication systems, including, but not limited to, wireless communication systems based on future $3^{rd}$ Generation Partnership Project (3GPP) standards.

Figure 12:
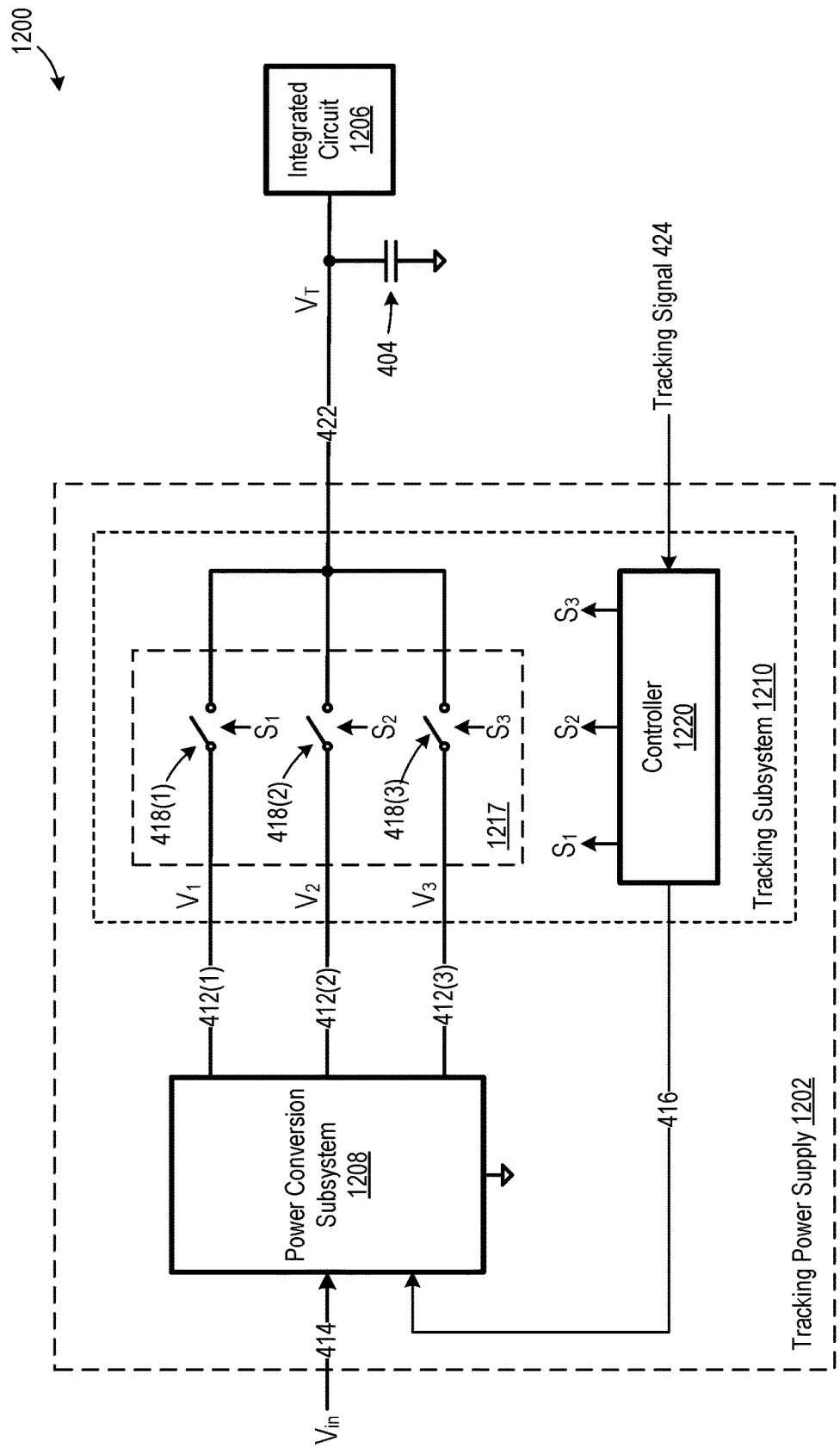
FIG. 12 is a block diagram of an embodiment of the FIG. 4 system including an integrated circuit powered by a tracking power supply.

FIG. 12 is a schematic diagram of a system 1200, which is an embodiment of system 400 of FIG. 4 where (a) load 406 is embodied by an integrated circuit 1206, (b) tracking power supply 402 is embodied by a tracking power supply 1202 where N is equal to three, (c) power conversion subsystem 408 is embodied by a power conversion subsystem 1208 generating three power rails 412, (d) tracking subsystem 410 is embodied by a tracking subsystem 1210, (e) switching network 417 is embodied by a switching network 1217 including three instances of switching devices 418, and (f) controller 420 is embodied by a controller 1220 generating switching signals $S_1$ through $S_3$. Integrated circuit 1206 is at least partially powered from tracking power rail 422. In some embodiments, integrated circuit 1206 is a processing unit (e.g., a central processing unit (CPU) or a graphics processing unit (GPU)), a field programmable gate array (FPGA), an application specific integrated circuit (ASIC) (e.g. for artificial intelligence and/or machine learning), and/or a memory unit.

Figure 13:
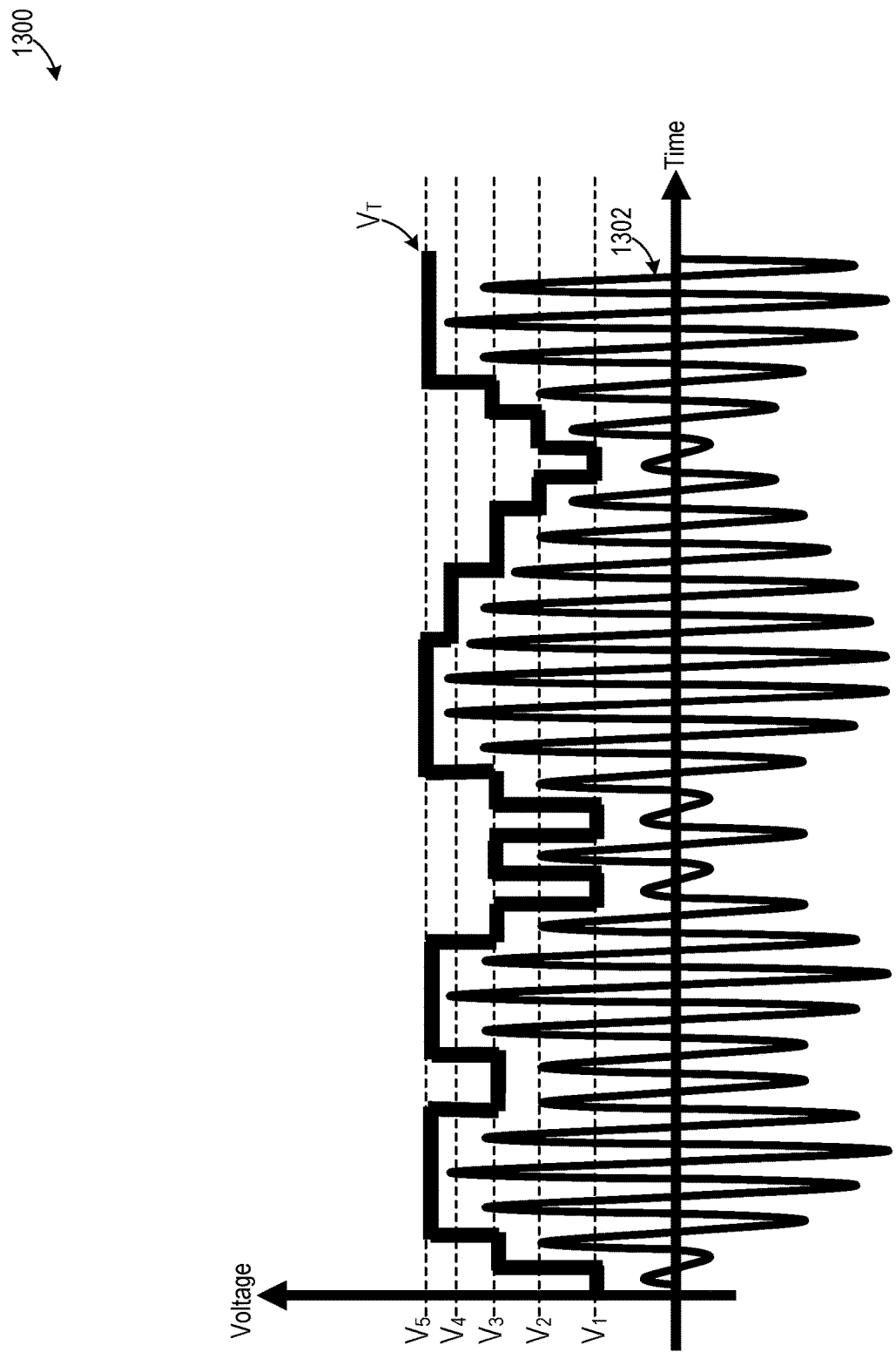
FIG. 13 is a graph of voltage versus time illustrating one example of operation of an embodiment of the FIG. 4 system including a power amplifier.

FIG. 13 is a graph 1300 of voltage versus time illustrating one example of operation of an embodiment of system 400 where N is equal to five and load 406 includes a power amplifier, such as system 1100 of FIG. 11 including power amplifier 1106. Graph 1300 includes a curve representing voltage $V_T$ of tracking power rail 422, as well as curve 1302 representing voltage at an output of the power amplifier. As illustrated in FIG. 13, voltage $V_T$ tracks an envelope of amplifier output voltage, thereby helping minimize power dissipation in the power amplifier. It should be appreciated that change in voltage $V_T$ is accomplished by changing state of switching network 417, i.e., by changing state of switching devices 418, such as in a manner similar to that discussed above with respect to Table 1, instead of by changing state of power conversion subsystem 408.

Figure 14B:
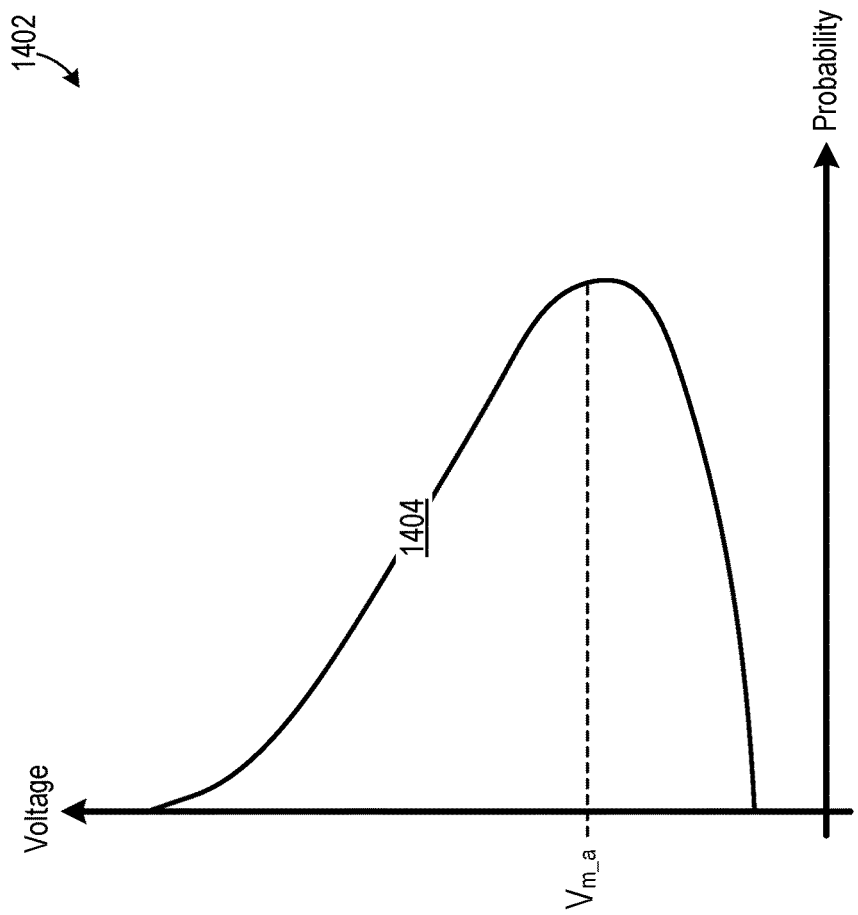
FIGS. 14A and 14B are graphs illustrating another example of operation of an embodiment of the FIG. 4 system.
Figure 14A:
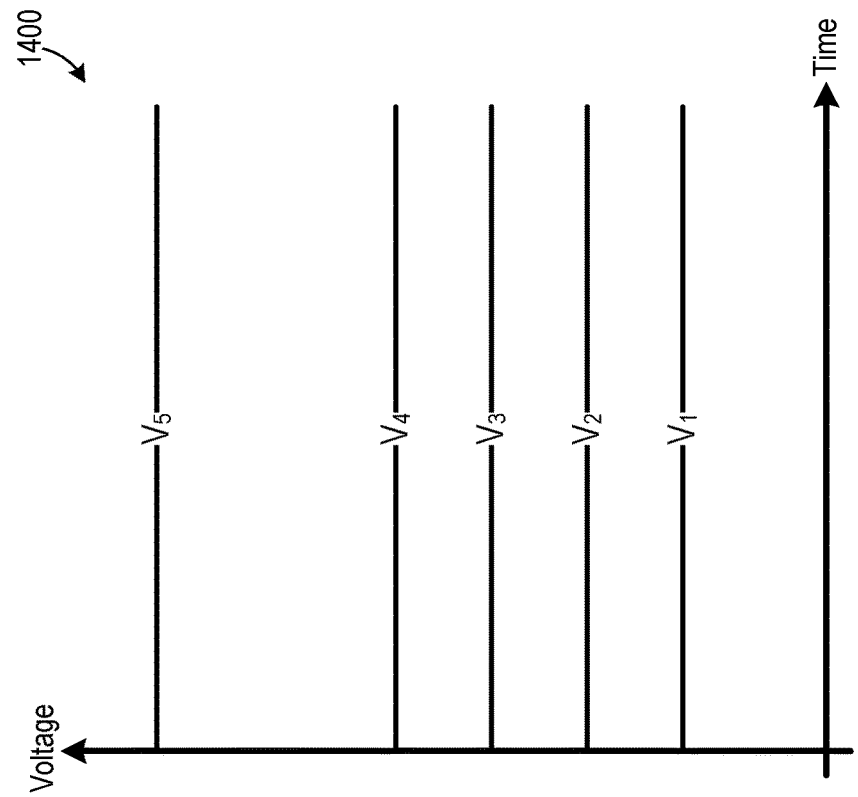

As discussed above, in certain embodiments, power conversion subsystem 408 is configured such that one or more voltages $V_k$ of power rails 412 may be changed in response to a voltage control signal 416. FIGS. 14A and 14B illustrate one example of how this feature can be used to help optimize value of voltage $V_T$ for load 406. FIG. 14A is graph 1400 of voltage versus time, and FIG. 14B is a graph 1402 of voltage versus probability, of one embodiment of system 400 where N is equal to five. The vertical axes of graphs 1400 and 1402 have a common voltage scale. Graph 1400 includes a respective curve for each of power rail 412 voltages $V_1$, $V_2$, $V_3$, $V_4$, and $V_5$. Graph 1402 includes a curve 1404 representing voltage required by load 406. As evident from graph 1402, voltage required by load 406 has a highest probability of being around $V_{m\_a}$, or stated differently, voltage required by load 406 is most likely to be around $V_{m\_a}$. As such, $V_{m\_a}$ may be considered a predicted required voltage of load 406. Therefore, it is advantageous for possible values of $V_T$ to be clustered around $V_{m\_a}$, instead of evenly distributed along the vertical axis of graph 1400, to increase granularity of available values of $V_T$ in the probable operating range of load 406. Voltage control signal 416 can be used to adjust power rail 412 voltages $V_k$ so that two or more of the voltages are clustered around voltage $V_{m\_a}$, as illustrated in FIG. 14A.

Figure 15B:
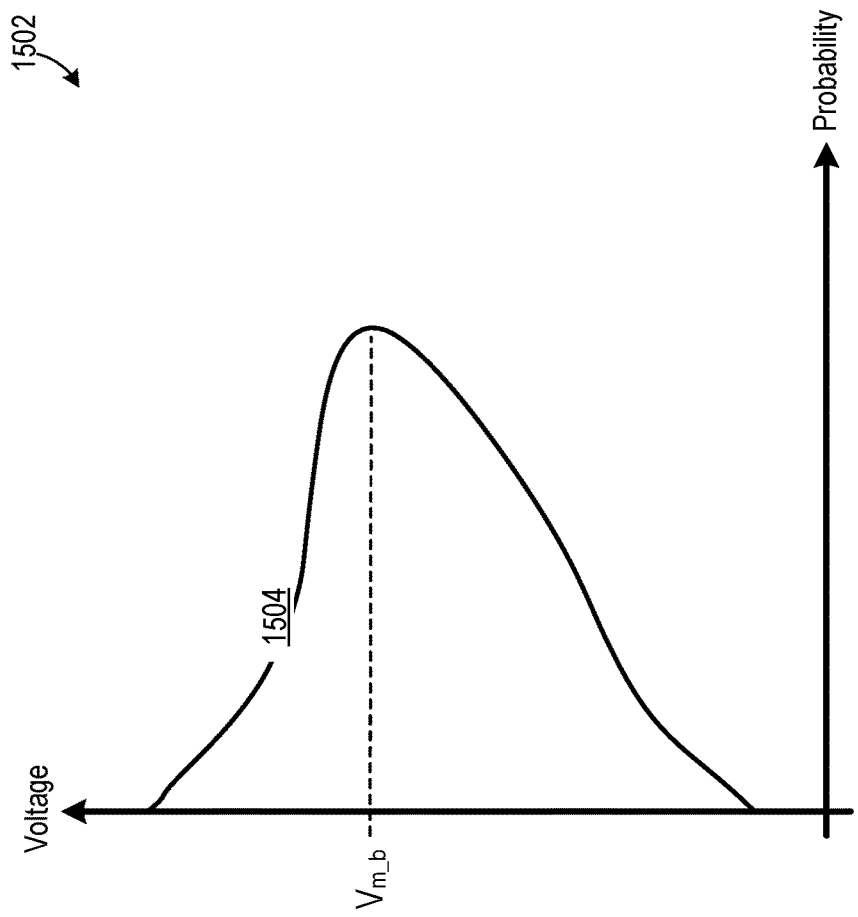
FIGS. 15A and 15B are graphs illustrating another example of operation of an embodiment of the FIG. 4 system.
Figure 15A:
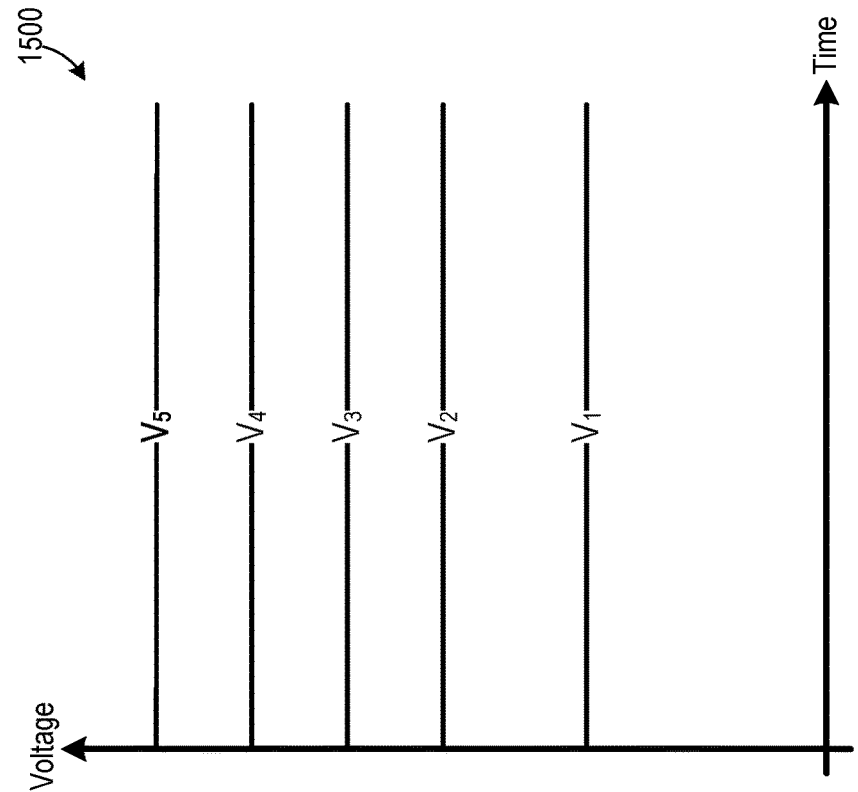

Additionally, voltage control signal 416 can be used to change power rail 412 voltages $V_k$ as the expected voltage requirement of load 406 changes. For example, FIGS. 15A and 15B are graphs 1500 and 1502 of voltage versus time and voltage versus probability, respectively, of the same embodiment of system 400 discussed above with respect to FIGS. 14A and 14B, but at a subsequent time. The vertical axes of graphs 1500 and 1502 have a common voltage scale. Graph 1500 includes a respective curve for each of power rail 412 voltages $V_1$, $V_2$, $V_3$, $V_4$, and $V_5$, and graph 1502 includes a curve 1504 representing voltage required by load 406. As evident from graph 1502, voltage required by load 406 has a highest probability of being around $V_{m\_b}$, which is higher than voltage $V_{m\_a}$ of FIG. 14A, such that voltage $V_{m\_b}$ is a new predicted required voltage of load 406. Accordingly, voltage control signal 416 can be used to adjust power rail voltages $V_k$ away from their values of FIG. 14A to new values illustrated in FIG. 15A, so that several of the voltages are now clustered around voltage $V_{m\_b}$, instead of $V_{m\_a}$, to help optimize power rail 412 voltages $V_k$ for the new voltage requirements of load 406. Such readjustment of voltages $V_k$ can be performed, for example, whenever voltage requirements of load 406 significantly change, such as by a predetermined minimum threshold amount.

Figure 16B:
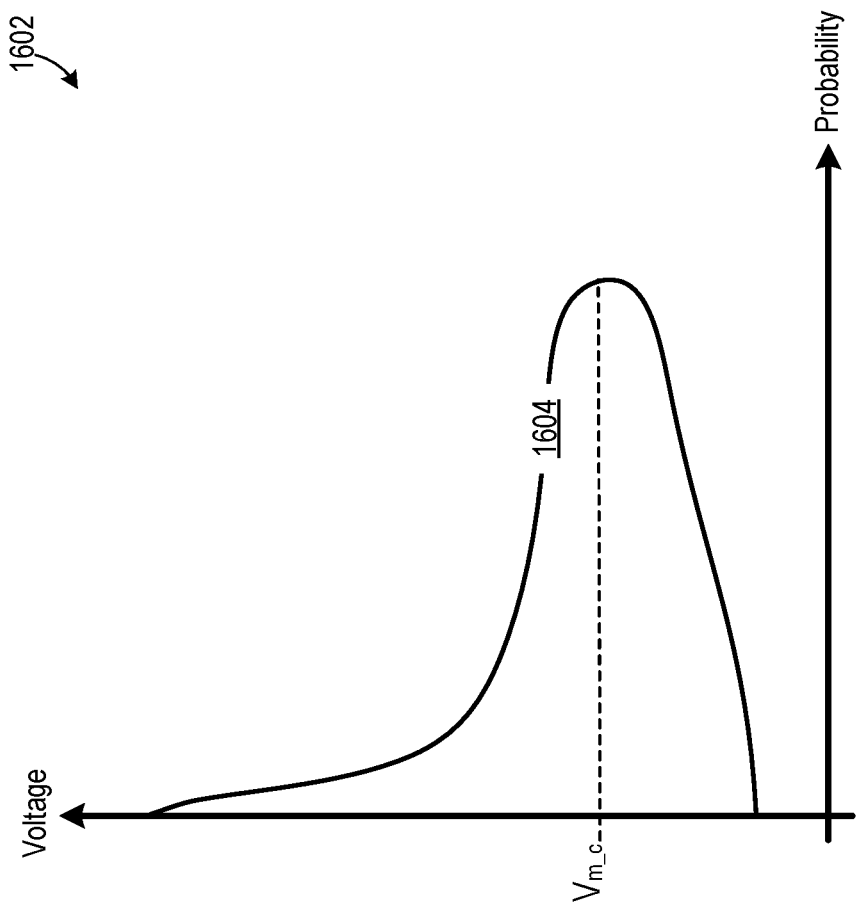
FIGS. 16A and 16B are graphs illustrating another example of operation of an embodiment of the FIG. 4 system.
Figure 16A:
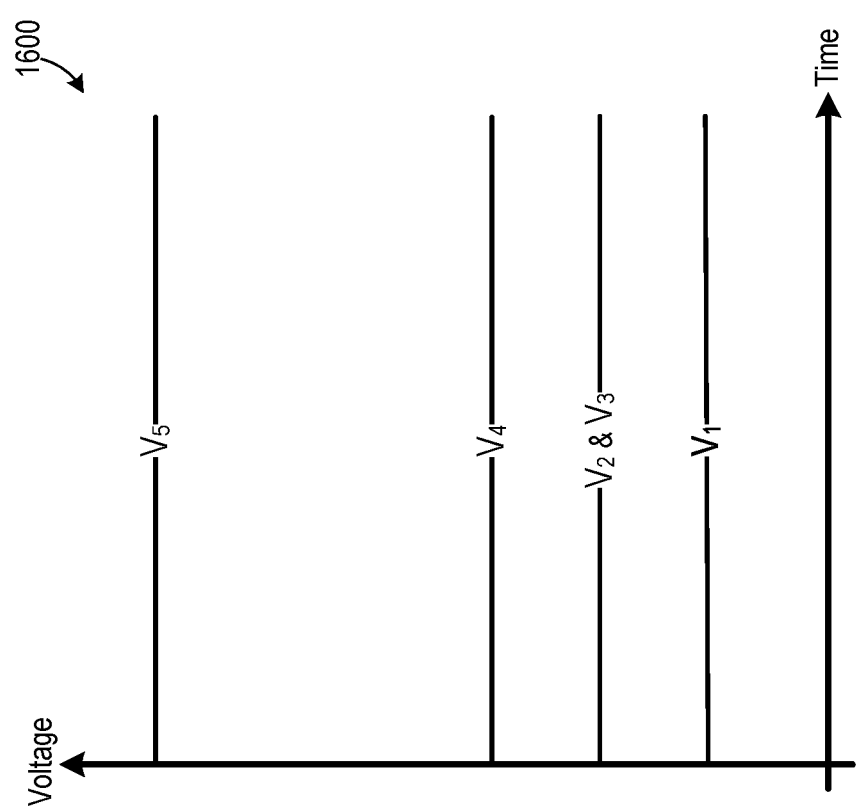

Referring again to FIG. 4, in some applications, it may be desirable for two or more power rails 412 to have a common voltage $V_k$, such as to enable power sharing by the power rails. For example, consider FIGS. 16A and 16B, which illustrate an example of operation of another embodiment of system 400 where N is equal to five. FIG. 16A is graph 1600 of voltage versus time, and FIG. 16B is a graph 1602 of voltage versus probability. The vertical axes of graphs 1600 and 1602 have a common voltage scale. Graph 1600 includes a respective curve for each of power rail 412 voltages $V_1$, $V_2$, $V_3$, $V_4$, and $V_5$. Graph 1602 includes a curve 1604 representing voltage required by load 406. As evident from graph 1602, voltage required by load 406 has a highest probability of being around $V_{m\_c}$. Additionally, the probability distribution of FIG. 16B is relatively narrow, such that there is a high probability that the voltage required by load 406 will be around $V_{m\_c}$. Therefore, it may be desirable that two or more power rails 412 have a common voltage $V_k$, to enable these power rails to collectively power load 406 under its most-probable operating conditions. Accordingly, voltage control signal 416 is used to set voltages $V_2$ and $V_3$ of power rails 412(2) and 412(3), respectively, to common value around $V_{m\_c}$, as illustrated in FIG. 16A. As discussed above, it is typically desirable that controller 420 be configured to generate switching signals $S_k$ such that only one switching device 418 is closed at a given time, to prevent shorting of power rails 412. However, controller 420 is optionally configured to allow a plurality of instances of switching device 418 to be closed at a common time if, and only if, their respective power rails 412 are at a common voltage, to enable power sharing by the power rails. Stated differently, controller 420 is optionally configured so that switching network 417 may simultaneously connect two or more power rails 412 to tracking power rail 422 if, and only if, the two or more power rails 412 are at a common voltage.

Figure 17:
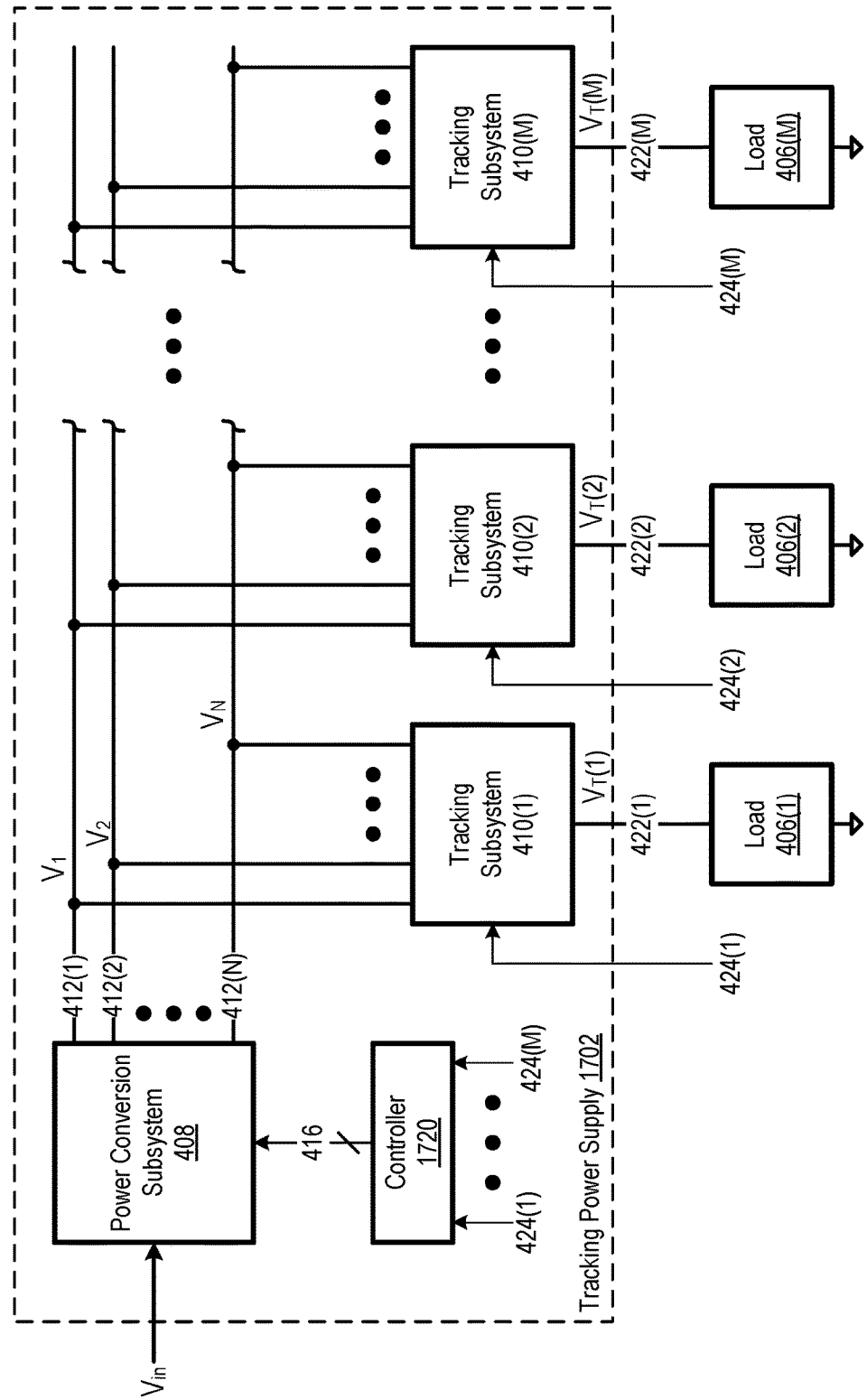
FIG. 17 is a block diagram of a system including an alternate embodiment of the FIG. 4 tracking power supply including a plurality of tracking subsystems.

Referring again to FIG. 4, tracking power supply 402 could be modified to include multiple tracking subsystems served by power conversion subsystem 408. For example, FIG. 17 is a schematic diagram of a system 1700 including a tracking power supply 1702, where tracking power supply 1702 is an embodiment of tracking power supply 402 including M tracking subsystems 410 powering respective loads 406, where M is an integer greater than one. Details of tracking subsystems 410, as well as optional capacitors 404 on tracking power rails 422, are not shown in FIG. 17 for illustrative clarity. Tracking subsystems 410 are connected to the N power rails 412 in parallel such that power conversion subsystem 408 provides electrical power to each tracking subsystem 410. In some embodiments, each tracking subsystem 410 operates as discussed above with respect to FIG. 4 to provide a tracking voltage $V_T$ to its respective load 406 based at least partially on a tracking signal 424 associated with the load, independent of operation of each other tracking subsystem 410.

Power conversion subsystem 408 is optionally controllable by voltage control signal 416 to adjust voltages $V_k$ of power rails 412. Voltage control signal 416 is generated, for example, so that voltages $V_k$ of power rails 412 meet the needs of all tracking subsystem 410 instances. As another example, voltage control signal 416 may be generated to optimize voltages $V_k$ of power rails 412 for the majority of tracking subsystem 410 instances. Voltage control signal 416 could be generated within tracking power supply 1702. For example, tracking power supply 1702 optionally further includes a controller 1720 configured to generate voltage control signal 416, such as at least partially based on tracking signals 424(1)-424(M). In some embodiments, controller 1720 is configured to generate tracking signal 416 in a manner similar to that discussed above with respect to one or more of FIGS. 4, 8, 9, 10, 14A, 14B, 15A, 15B, 16A, and 16B.

In another embodiment, controller 1720 is configured to generate voltage control signal 416 to adjust voltages $V_k$ of power rails 412 based at least partially on historical values of tracking signals 424(1)-424(M), such as to help optimize available voltages $V_k$ of power rails 412 for operating conditions of loads 406. For example, in some embodiments, controller 1720 is configured to predict most-likely power supply voltages required by loads 406 based on historical operating conditions of load 406, e.g., based on historical values of tracking signals 424(1)-424(M), and controller 1720 is configured to adjust available voltages $V_k$ so that they are at least partially clustered around the most-likely required power supply voltages. Some embodiments of controller 1720 include a neural network or other machine learning model configured to predict a most-likely power supply voltage required by loads 406.

Voltage control signal 416 could alternately be generated external to tracking power supply 1702 and controller 1720 could therefore be omitted. In scenarios where several loads 406 have the same power supply voltage requirement, it may be desirable that two or more power rails 412 have a common voltage to enable power sharing among the power rails, such as in a manner similar to that discussed above with respect to FIGS. 16A and 16B.

Figure 18:
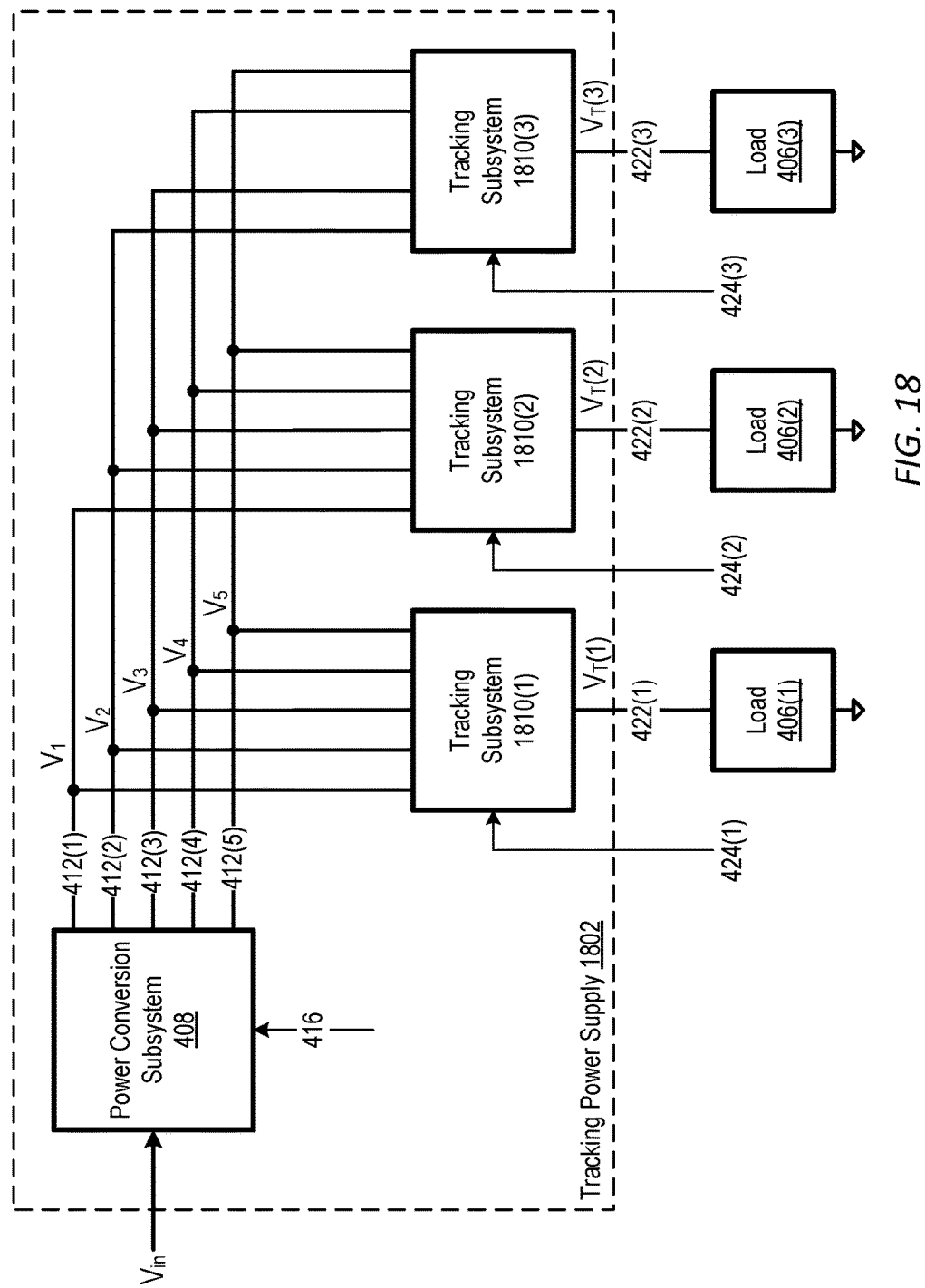
FIG. 18 is a block diagram of a system including an alternate embodiment of the FIG. 17 tracking power supply.

Tracking subsystems 410 have a common configuration in tracking power supply 1702 of FIG. 17. However, tracking power supply 402 could also be modified to include a plurality of tracking subsystems where at least two of the tracking subsystems have different respective configurations. For example, FIG. 18 is a schematic diagram of a system 1800 including a tracking power supply 1802, which is an alternate embodiment of tracking power supply 1702 of FIG. 17. In this embodiment, power conversion subsystem 408 is configured to generate five power rails 412, and tracking power supply 1802 includes three tracking subsystems 1810(1)-1810(3), where each tracking subsystem 1810 is an embodiment of tracking subsystem 410 of FIG. 4. Tracking subsystems 1810(1) and 1810(2) have a common configuration and are connected to each of power rails 412(1)-412(5). Tracking subsystem 1810(3), however, has a different configuration than tracking subsystems 1810(1) and 1810(2), and tracking subsystem 1810(3) is connected to only power rails 412(2)-412(5).

Figure 19:
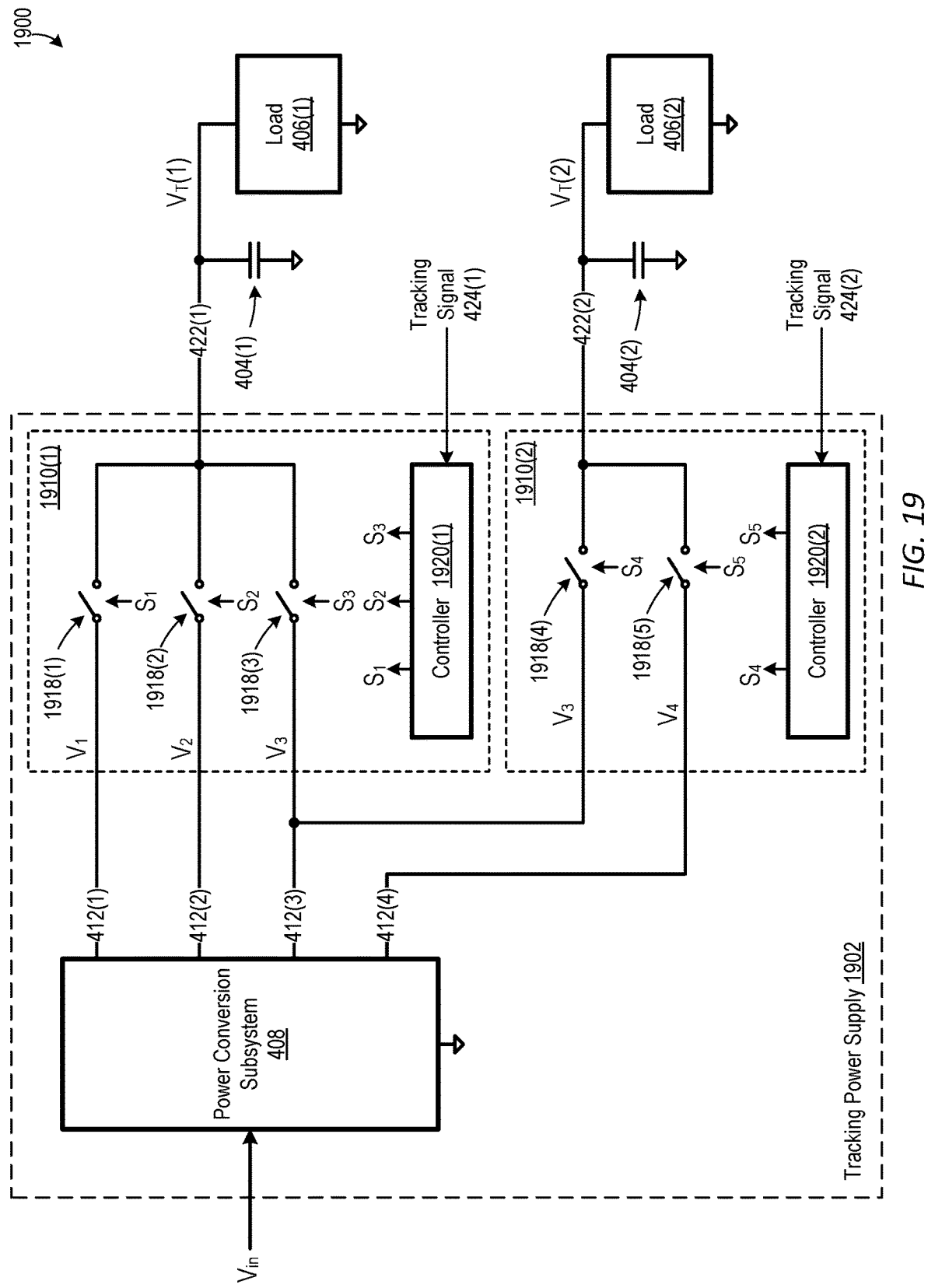
FIG. 19 is a block diagram of a system including an alternate embodiment of the FIG. 4 tracking power supply including two tracking subsystems having different configurations.

As another example, FIG. 19 is a schematic diagram of a system 1900 including a tracking power supply 1902, which is an embodiment of tracking power supply 402 where N is equal to four and the tracking power supply includes two tracking subsystems 1910 powering respective loads 406. Each tracking subsystem 1910 is an embodiment of tracking subsystem 410, and each tracking subsystem 1910 has a different configuration.

Specifically, tracking subsystem 1910(1) includes three switching devices 1918(1)-1918(3) and a controller 1920(1). Switching devices 1918(1)-1918(3) are embodiments of switching devices 418 of FIG. 4, and controller 1920(1) is an embodiment of controller 420 of FIG. 4. Switching devices 1918(1)-1918(3) are electrically coupled between respective power rails 412(1)-412(3) and a common tracking power rail 422(1). Controller 1920(1) is configured to generate switching signal $S_1$-$S_3$ according to a tracking signal 424(1) associated with load 406(1), independent of operation of tracking subsystem 1910(2), in a manner analogous to that discussed above with respect to controller 420 of FIG. 4. Load 406(1) is at least partially electrically powered from tracking power rail 422(1), and a capacitor 404(1) is optionally electrically coupled to tracking power rail 422(1).

Tracking subsystem 1910(2) includes two switching devices 1918(4) and 1918(5) and a controller 1920(2). Switching devices 1918(4) and 1918(5) are embodiments of switching devices 418 of FIG. 4, and controller 1920(2) is an embodiment of controller 420 of FIG. 4. Switching devices 1918(4) and 1918(5) are electrically coupled between respective power rails 412(3) and 412(4) and a common tracking power rail 422(2). Controller 1920(2) is configured to generate switching signal $S_4$ and $S_5$ according to a tracking signal 424(2) associated with load 406(2), independent of operation of tracking subsystem 1910(1), in a manner analogous to that discussed above with respect to controller 420 of FIG. 4. Load 406(2) is at least partially electrically powered from tracking power rail 422(2), and a capacitor 404(2) is optionally electrically coupled to tracking power rail 422(2).

Accordingly, in tracking power supply 1902, power rails 412(1) and 412(2) are dedicated to tracking subsystem 1910, power rail 412(4) is dedicated to tracking subsystem 1910(2), and power rail 412(3) is shared by tracking subsystems 1910(1) and 1910(2). However, tracking power supply 1902 could be modified to have a different number of power rails 412, a different division of dedicated power rails 412 and shared power rails 412, a different number of tracking subsystems 1910, and/or different configurations of tracking subsystems 1910.

Figure 20:
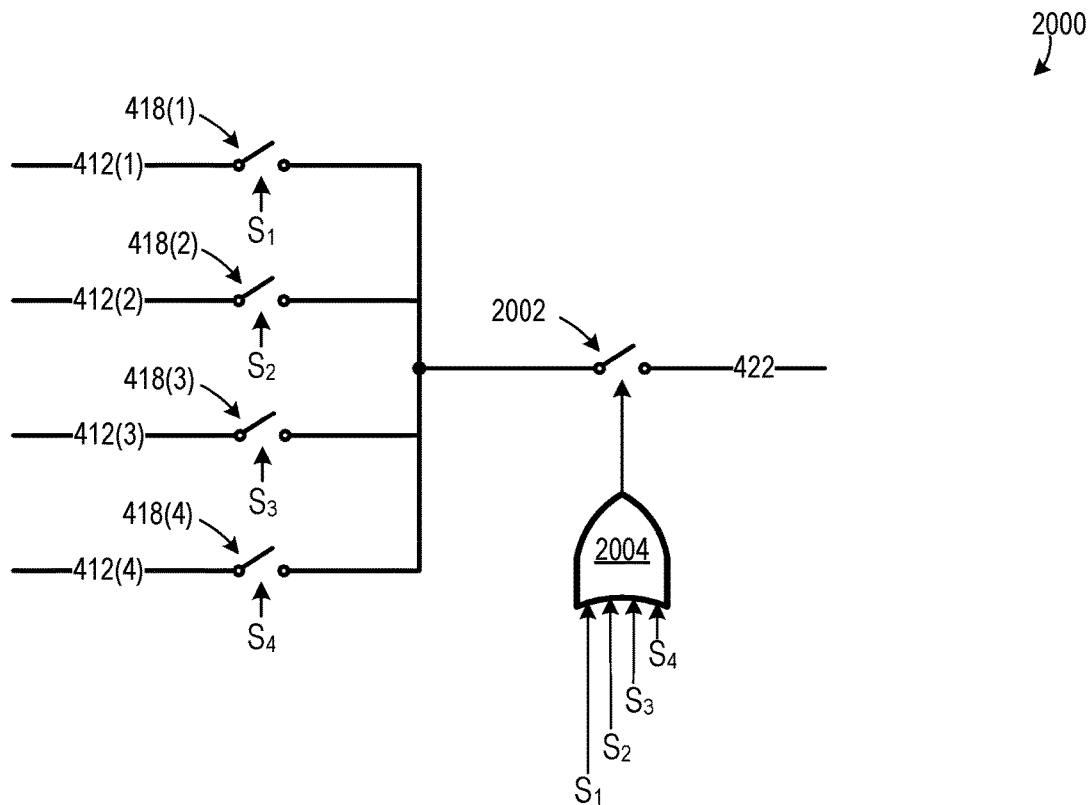
FIG. 20 is a schematic diagram of an alternate embodiment of a switching network of the FIG. 4 tracking power supply.

As discussed above with respect to FIG. 4, switching network 417 may have a different configuration as long as it is capable of selectively connecting one or more power rails 412 to tracking power rail 422 in response to one or more switching signals $S_k$. For example, FIG. 20 is a schematic diagram of a switching network 2000, which is one possible alternate embodiment of switching network 417 where N is equal to four. Switching network 2000 includes an additional switching device 2002 electrically coupled between each switching device 418(1)-418(4) and tracking power rail 422. Additional switching device 2002 is included, for example, for safety purposes so that tracking power rail 422 is isolated from power rails 412 by an additional switching device during times when it is desired that tracking power rail 422 be deenergized. Additional switching device 2002 is controlled by an OR-gate 2004, which receives as an inputs each of switching signals $S_1$-$S_4$. Accordingly, additional switching device 2002 is closed whenever any one of switching devices 418(1)-418(4) is closed, and additional switching device 2002 is open when all switching devices 418(1)-418(4) are open.

Figure 21:
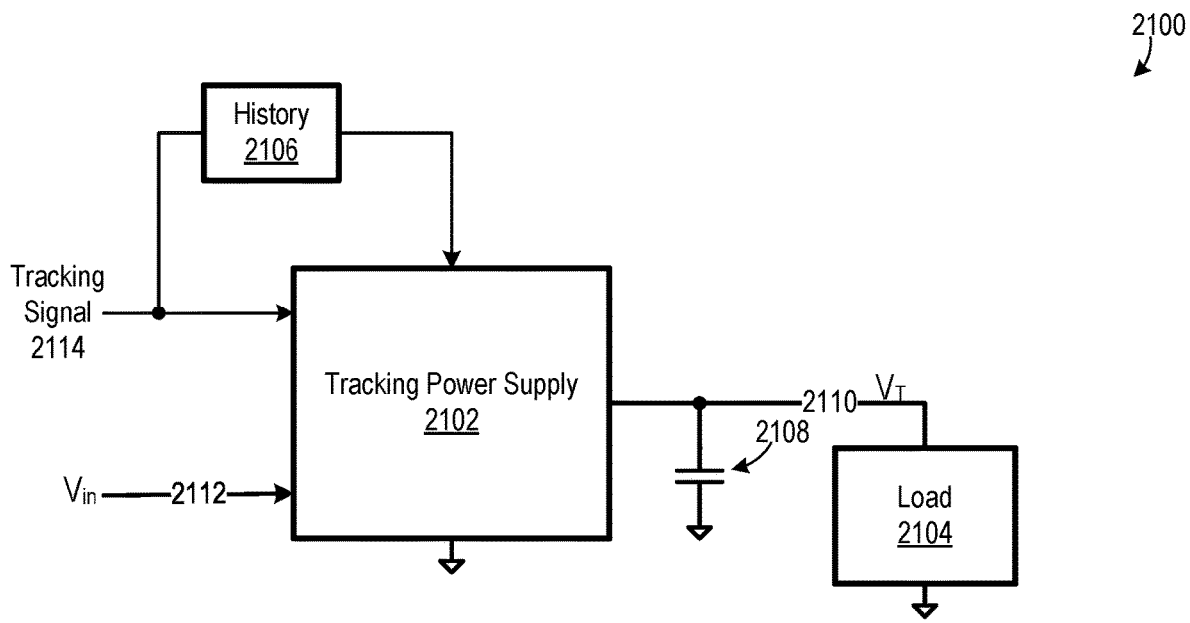
FIG. 21 is a block diagram of a system including a tracking power supply and a historical control module, according to an embodiment.

The concept of adjusting power rail voltage according to historical power supply voltage requirements of a load is not limited to the tracking power supplies discussed above. Instead, the concept can be applied to other power supply configurations. For example, FIG. 21 is a block diagram of a system including a tracking power supply 2102, a load 2104, a historical control module 2106, and an optional capacitor 2108. Tracking power supply 2102 is configured to convert an input voltage $V_{in}$ on an input power rail 2112 to one of X available voltages $V_T$ on a tracking power rail 2110, at least partially based on a tracking signal 2114, where X is an integer greater than one. For example, consider an embodiment where X is equal to four. In this example embodiment, voltage $V_T$ can be any one of four different values, depending on the value of tracking signal 2114. Tracking power supply 2102 can have essentially any configuration as long as it is capable of outputting X different voltages $V_T$ on tracking power rail 2110 in response to tracking signal 2114. Load 2104 is at least partially electrically powered from tracking power rail 2110. Tracking signal 2114, which is analogous to tracking signal 424 of FIG. 4, is associated with load 2104. For example, in some embodiments, tracking signal 2114 represents power supply voltage requirements of load 2104.

Historical control module 2106 is configured to adjust one or more of the X available values of tracking voltages $V_T$ based at least partially on historical values of tracking signal 2114, such as to help optimize available tracking voltages $V_T$ for load 2104's operating conditions. For example, in some embodiments, historical control module 2106 is configured to predict a most-likely power supply voltage required by load 2104 based on historical values of tracking signal 2114, and historical control module 2106 is configured to adjust available tracking voltages $V_T$ so that they are at least partially clustered around the most-likely required power supply voltage. Some embodiments of historical control module 2106 include a neural network or other machine learning model configured to predict a most-likely power supply voltage required by load 2104. While tracking power supply 2102 quickly changes tracking power rail voltage $V_T$ in response to a change in tracking signal 2114, historical control module 2106 may be configured to adjust tracking power rail voltages $V_T$ at a slower rate than power supply 2102 responds to changes in tracking signal 2114.

Figure 22B:
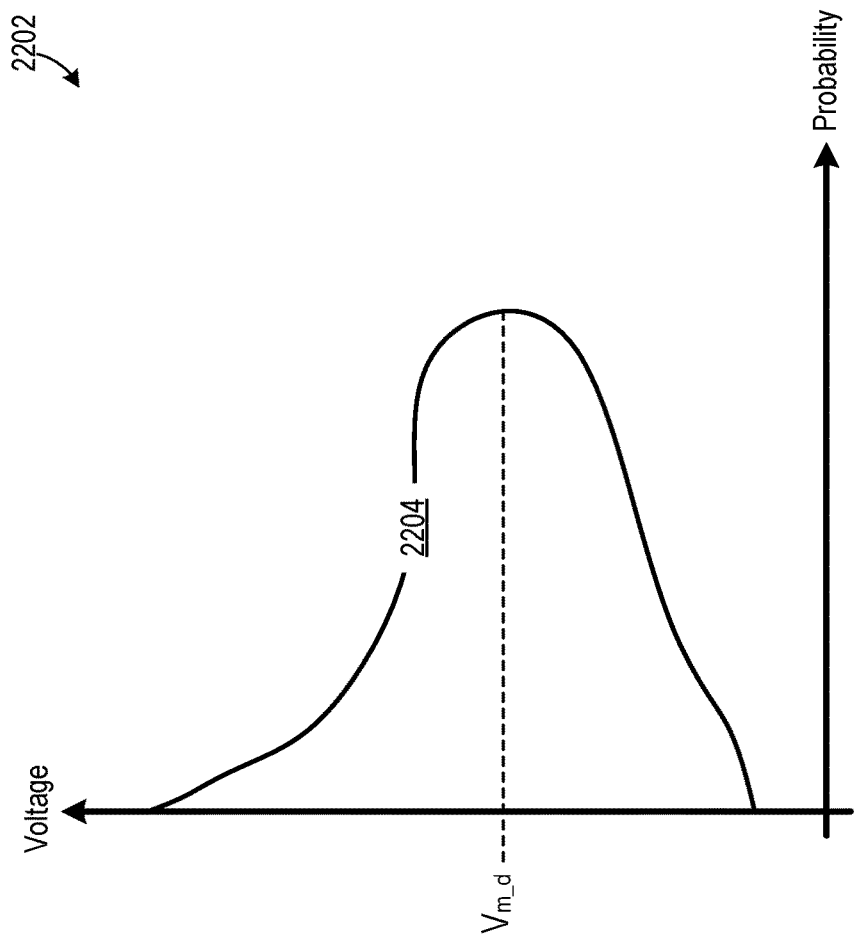
FIGS. 22A and 22B are graphs illustrating an example of operation of the historical control module of the FIG. 21 system.
Figure 22A:
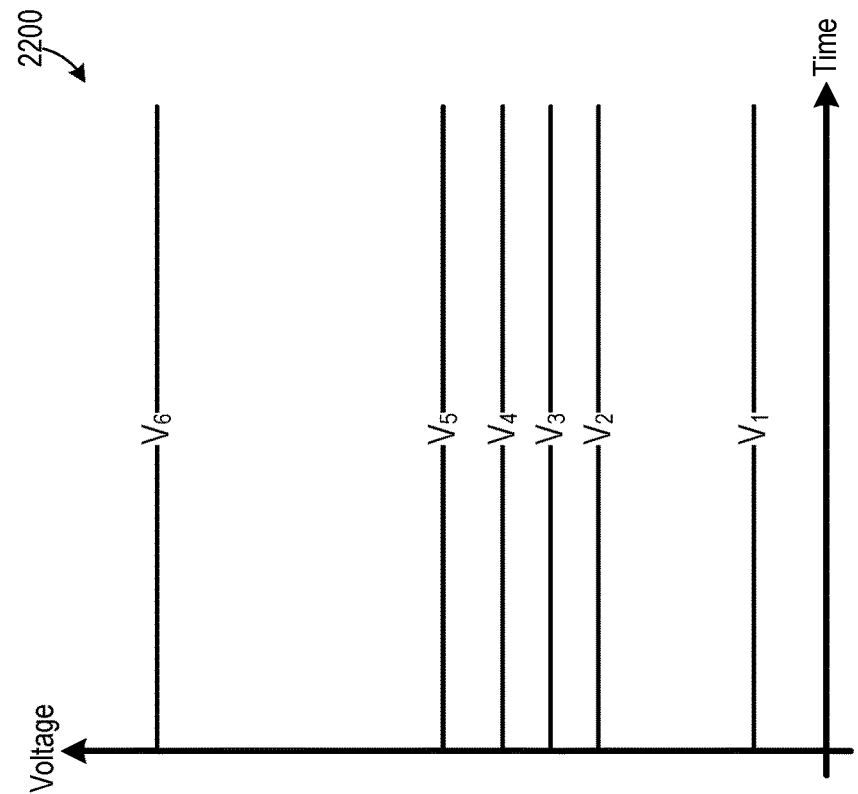

FIGS. 22A and 22B illustrate one example of operation of historical control module 2106 in an embodiment where X is equal to six, such that $V_T$ can be any one of six values $V_1$-$V_6$. FIG. 22A is graph 2200 of voltage versus time, and FIG. 22B is a graph 2202 of voltage versus probability. The vertical axes of graphs 2200 and 2202 have a common voltage scale. Graph 2200 includes a respective curve for each of the six possible values of voltage $V_T$. Graph 2202 includes a curve 2204 representing voltage required by load 2104. Historical control module 2106 determines or predicts that voltage required by load 2104 has a highest probability of being around $V_{m\_d}$, as illustrated in graph 2202. In response, historical control module 2106 controls tracking power supply 2102 so that several of the six possible values of voltage $V_T$ are clustered around voltage $V_{m\_d}$, as shown in FIG. 22A, to increase granularity of available values of $V_T$ in the probable operating range of load 2104. Historical control module 2106 may configured to adjust the possible values of voltage $V_T$ in response to a change in predicted power supply voltage requirements of load 2104.

Figure 23:
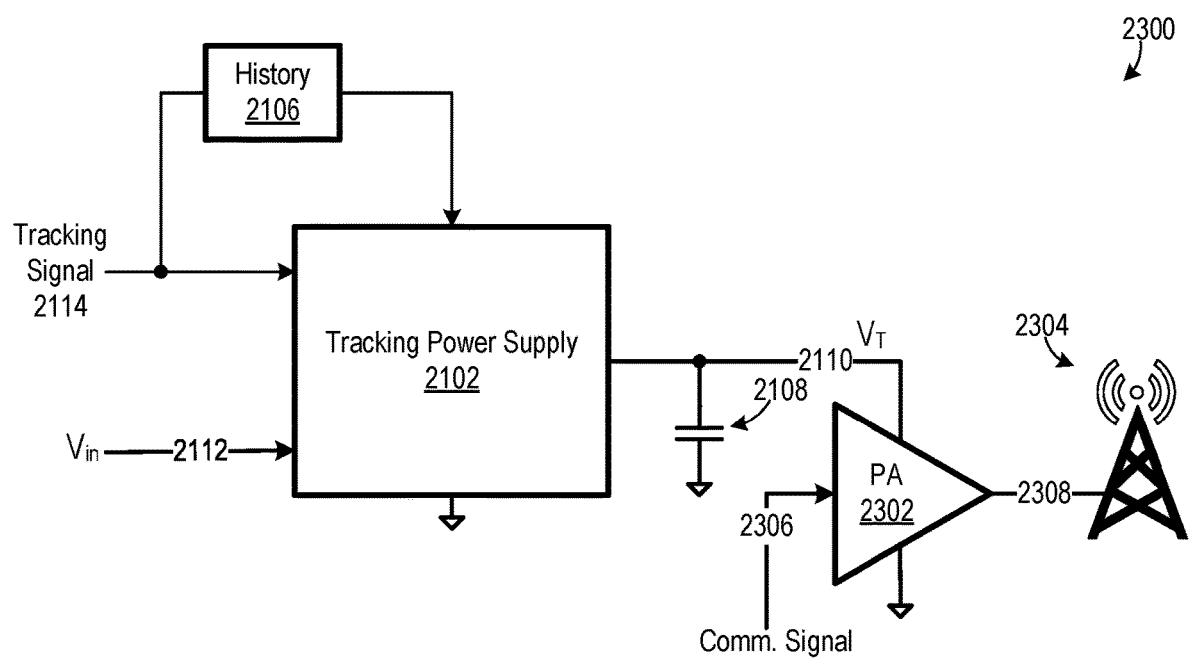
FIG. 23 is a block diagram of an embodiment of the FIG. 21 system including a power amplifier powered by the tracking power supply of the FIG. 21 system.

By way of example and not limitation, load 2104 may include a power amplifier or one or more integrated circuits. For example, FIG. 23 is a block diagram of system 2300, which is an embodiment of system 2100 of FIG. 21 where load 2104 includes a power amplifier 2302 communicatively coupled to an antenna 2304. Power amplifier 2302, which is at least partially powered from tracking power rail 2110, is configured to amplify a communication signal 2306 to generate an amplified signal 2308 which drives antenna 2304. In some embodiments, power amplifier 2302 and antenna 2304 are part of one or more of (a) a fourth generation (4G) cellular wireless communication system, such as a long term evolution (LTE) wireless communication system, (b) a fifth generation (5G) new radio (NR) cellular wireless communication system, (c) a sixth generation (6G) cellular wireless communication system, (d) a Wi-Fi wireless communication system, (e) a Bluetooth wireless communication system, (f) a LoRa wireless communication system, (g) a Zigbee wireless communication system, and (h) extensions, modifications, and successors of any of the foregoing communication systems, including, but not limited to, wireless communication systems based on future $3^{rd}$ Generation Partnership Project (3GPP) standards.

Figure 24:
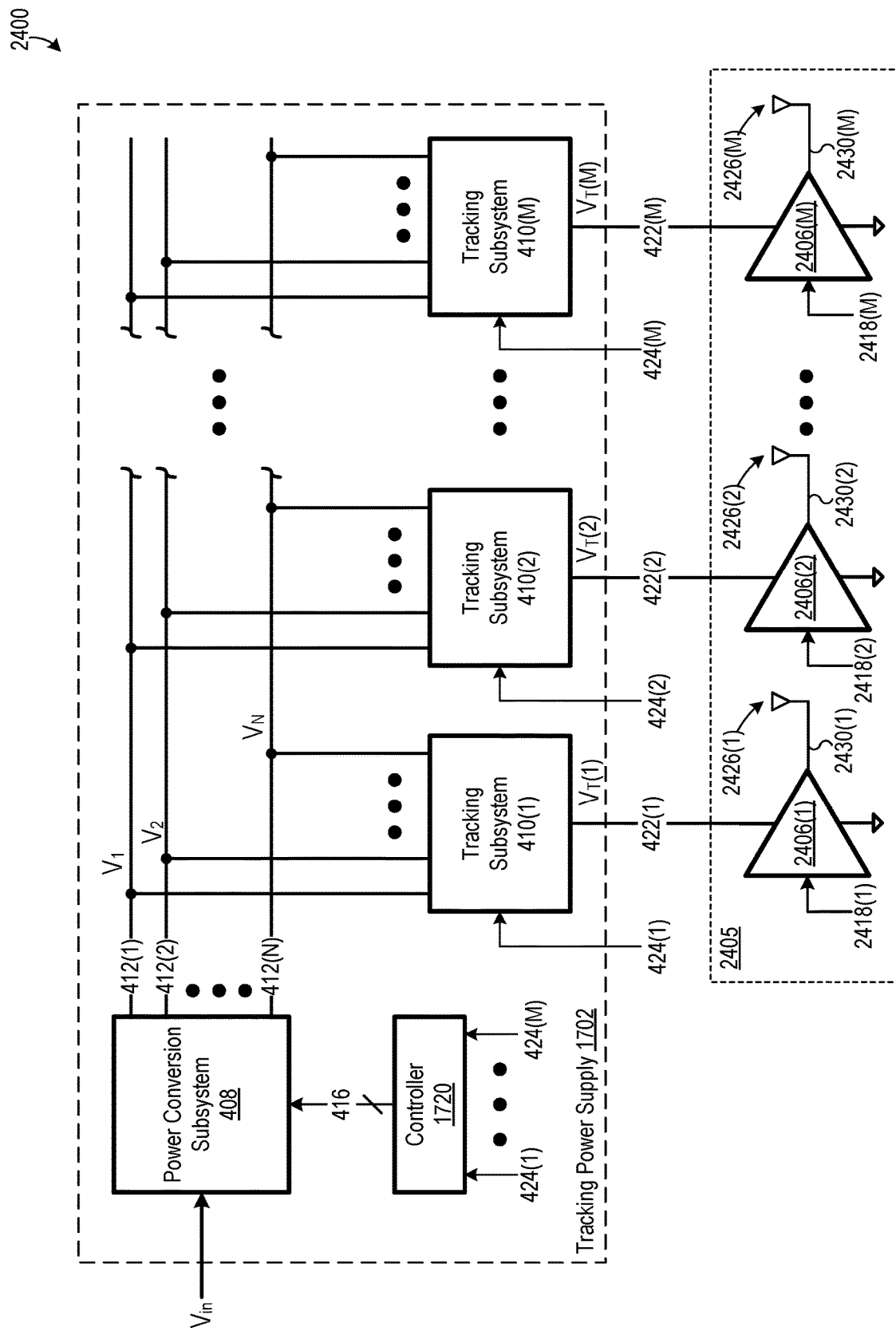
FIG. 24 is a block diagram of an embodiment of the FIG. 17 system where a plurality of loads are collectively embodied by a radio subsystem.

FIG. 24 is a schematic diagram of a system 2400, which is an embodiment of system 1700 of FIG. 17 where loads 406 are collectively embodied by a radio subsystem 2405. Radio subsystem 2405 includes a respective power amplifier 2406 and antenna 2426 for each tracking subsystem 410, such that each tracking subsystem 410 at least partially powers a power amplifier 2406. Each power amplifier 2406 is configured to amplify a respective communication signal 2428 to generate a respective amplified signal 2430 which drives a respective antenna 2426. In some embodiments, radio subsystem 2405 includes additional elements (not shown) for receiving signals, such as a respective receiver (not shown) electrically coupled to each antenna 2426. Certain embodiments of radio subsystem 2405 at least partially operate according to a multiple-input and multiple output (MIMO) wireless communication technique. All elements of radio subsystem 2405 need not be collocated. For example, in some embodiments, power amplifiers 2406 are remote from antennas 2426. In particular embodiments, radio subsystem 2405 is part of a MIMO cellular wireless communication system or a MIMO Wi-Fi wireless communication system.

Figure 25:
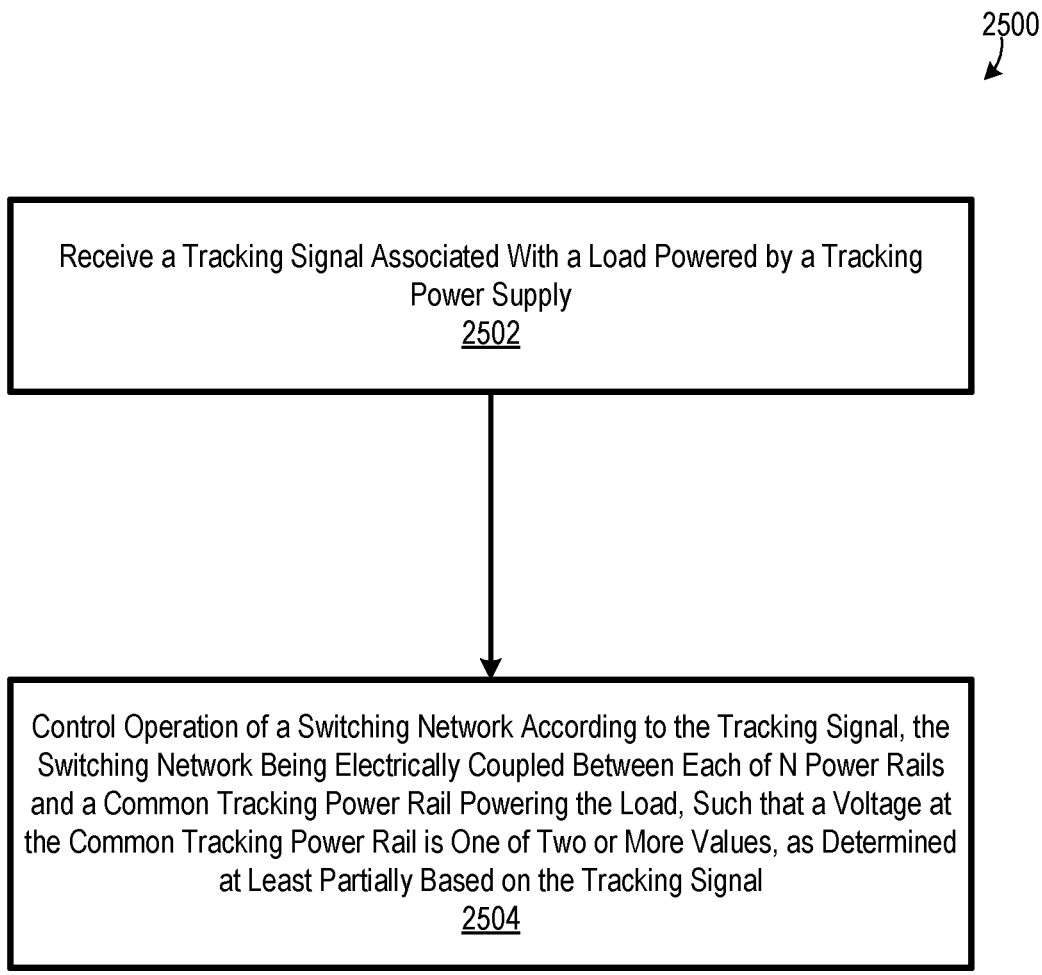
FIG. 25 is a flow chart of a method for operating a tracking power supply, according to an embodiment.

FIG. 25 is a flow chart of a method for operating a tracking power supply. In a block 2502 of method 2500, a tracking signal is received, where the tracking signal is associated with a load powered by the tracking power supply. In one example of block 2502, controller 420 of tracking subsystem 410 receives tracking signal 424 associated with load 406 (FIG. 4). In a block 2504 of method 2500, operation of a switching network is controlled according to the tracking signal, where (a) the switching network is electrically coupled between each of N power rails and a common tracking power rail powering the load, and (b) N is an integer greater than one. Operation of the switching network is controlled such that a voltage at the common tracking power rail is one of two or more values, as determined at least partially based on the tracking signal. In one example of block 2504, controller 420 generates switching signals $S_1$-$S_N$ to control operation of switching devices 418 of switching network 417 according to tracking signal 424, such that voltage $V_T$ is one of voltages $V_1$-$V_N$, as determined at least partially based on tracking signal 424.

Combinations of Features

Features described above may be combined in various ways without departing from the scope hereof. The following examples illustrate some possible combinations.

(A1) A tracking power supply includes a power conversion subsystem and one or more tracking subsystems. The power conversion subsystem is configured to generate N power rails, where N is an integer greater than one. Each tracking subsystem includes (1) a switching network electrically coupled between each of the N power rails and a tracking power rail of the tracking power supply and (2) a controller configured to (i) control operation of the switching network according to a tracking signal associated with a load powered by the tracking power supply, such that a voltage at the tracking power rail is one of two or more values, as determined at least partially based on the tracking signal and (ii) adjust voltage of at least one of the N power rails.

(A2) In the tracking power supply denoted as (A1), the controller may be further configured to adjust voltage of at least one of the N power rails at least partially according to a requirement of the load.

(A3) In any one of the tracking power supplies denoted as (A1) and (A2), the controller may be further configured to adjust voltage of at least one of the N power rails at least partially to optimize voltage of the at least one of the N power rails for the load.

(A4) In any one of the tracking power supplies denoted as (A1) through (A3), the controller may be further configured to adjust voltage of at least one of the N power rails at least partially according to an operating condition of the load.

(A5) In any one of the tracking power supplies denoted as (A1) through (A4), the controller may be further configured to adjust voltage of at least one of the N power rails at least partially according to historical operating conditions of the load.

(A6) In any one of the tracking power supplies denoted as (A1) through (A5), the controller may be further configured to adjust voltage of at least one of the N power rails at least partially according to historical values of the tracking signal.

(A7) In any one of the tracking power supplies denoted as (A1) through (A6), the controller may be further configured to adjust voltage of at least one of the N power rails at least partially according to a predicted required voltage of the load.

(A8) In any one of the tracking power supplies denoted as (A1) through (A7), the controller may be further configured to adjust voltage of at least one of the N power rails at least partially so that respective voltages of at least two of the N power rails are clustered around a predicted required voltage of the load.

(A9) In any one of the tracking power supplies denoted as (A1) through (A8), the controller may be further configured to (1) adjust voltage of at least first and second power rails of the N power rails such that the first and second power rails are at a common voltage and (2) control operation of the switching network such that the load is simultaneously electrically connected to each of the first and second power rails.

(A10) In any one of the tracking power supplies denoted as (A1) through (A9), the switching network may include N switching devices, where each switching device is electrically coupled between a respective one of the N power rails and the tracking power rail.

(A11) In any one of the tracking power supplies denoted as (A1) through (A10), the power conversion subsystem may be further configured so that at least two of the N power rails are at different respective voltages.

(A12) In any one of the tracking power supplies denoted as (A1) through (A10), the controller may be further configured such that (1) at least two of the N power rails are at different respective voltages and (2) two or more of the N power rails may be connected to the tracking power rail only if the two or more of the N power rails are at a common voltage.

(B1) A system includes a plurality of loads and a tracking power supply. The tracking power supply includes (1) a power conversion subsystem configured to generate N power rails, N being an integer greater than one, and (2) a respective tracking subsystem for each load, each tracking subsystem being configured to selectively connect its respective load to one or more of the N power rails at least partially based on a tracking signal associated with its respective load.

(B2) The system denoted as (B1) may further include a controller configured to adjust voltage of at least one of the N power rails according to a requirement of one or more of the plurality of loads.

(B3) In any one of the systems denoted as (B1) and (B2), each load of the plurality of loads may include a respective power amplifier.

(C1) A method for operating a tracking power supply includes (1) receiving a tracking signal associated with a load powered by the tracking power supply, (2) controlling operation of a switching network according to the tracking signal, the switching network being electrically coupled between each of N power rails and a common tracking power rail powering the load, N being an integer greater than one, such that a voltage at the common tracking power rail is one of two or more values, as determined at least partially based on the tracking signal, and (3) adjusting voltage of at least one of the N power rails.

(C2) The method denoted as (C1) may further include adjusting voltage of at least one of the N power rails according to a requirement of the load.

(C3) Any one of the methods denoted as (C1) and (C2) may further include adjusting voltage of at least one of the N power rails according to an operating condition of the load.

(C4) Any one of the methods denoted as (C1) through (C3) may further include adjusting voltage of at least one of the N power rails according to historical operating conditions of the load.

(C5) Any one of the methods denoted as (C1) through (C4) may further include adjusting voltage of at least one of the N power rails according to a predicted required voltage of the load.

Changes may be made in the above methods, devices, and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which as a matter of language, might be said to fall therebetween.

What is claimed is:

1. A tracking power supply, comprising:
   a power conversion subsystem configured to generate N power rails, N being an integer greater than one; and
   one or more tracking subsystems, each tracking subsystem including:
      a switching network electrically coupled between each of the N power rails and a tracking power rail of the tracking power supply; and
   a controller configured to:
      control operation of the switching network according to a tracking signal associated with a load powered by the tracking power supply, such that a voltage at the tracking power rail is one of two or more values, as determined at least partially based on the tracking signal,
      generate a voltage adjustment signal; and
      adjust a voltage value of at least one of the N power rails by feeding the generated voltage adjustment signal to the power conversion subsystem.

2. The tracking power supply of claim 1, wherein the controller is further configured to adjust the voltage value of at least one of the N power rails at least partially according to a requirement of the load.

3. The tracking power supply of claim 1, wherein the controller is further configured to adjust the voltage value of at least one of the N power rails at least partially to optimize the voltage value of the at least one of the N power rails for the load.

4. The tracking power supply of claim 1, wherein the controller is further configured to adjust the voltage value of at least one of the N power rails at least partially according to an operating condition of the load.

5. The tracking power supply of claim 1, wherein the controller is further configured to adjust the voltage value of at least one of the N power rails at least partially according to historical operating conditions of the load.

6. The tracking power supply of claim 1, wherein the controller is further configured to adjust the voltage value of at least one of the N power rails at least partially according to historical values of the tracking signal.

7. The tracking power supply of claim 1, wherein the controller is further configured to adjust the voltage value of at least one of the N power rails at least partially according to a predicted required voltage of the load.

8. The tracking power supply of claim 1, wherein the controller is further configured to adjust the voltage value of at least one of the N power rails at least partially so that respective voltages of at least two of the N power rails are clustered around a predicted required voltage of the load.

9. The tracking power supply of claim 1, wherein the controller is further configured to:
adjust the voltage value of at least first and second power rails of the N power rails such that the first and second power rails are at a common voltage; and
control the operation of the switching network such that the load is simultaneously electrically connected to each of the first and second power rails.

10. The tracking power supply of claim 1, wherein the power conversion subsystem is further configured so that at least two of the N power rails are at different respective voltages.

11. The tracking power supply of claim 1, wherein the switching network comprises N switching devices, each switching device being electrically coupled between a respective one of the N power rails and the tracking power rail.

12. The tracking power supply of claim 1, wherein the controller is further configured such that:
at least two of the N power rails are at different respective voltages; and
two or more of the N power rails may be connected to the tracking power rail only if the two or more of the N power rails are at a common voltage.

13. A system, comprising:
a plurality of loads; and
a tracking power supply, including:
a power conversion subsystem configured to generate N power rails, N being an integer greater than one,
a respective tracking subsystem for each load, each tracking subsystem being configured to selectively connect its respective load to one or more of the N power rails at least partially based on a tracking signal associated with its respective load; and
a controller configured to:
generate a voltage adjustment signal; and
adjust a voltage value of at least one of the N power rails by feeding the generated voltage adjustment signal to the power conversion subsystem.

14. The system of claim 13, wherein the controller is configured to adjust the voltage value of at least one of the N power rails according to a requirement of one or more of the plurality of loads.

15. The system of claim 13, wherein each load of the plurality of loads comprises a respective power amplifier.

16. A method for operating a tracking power supply, comprising:
receiving a tracking signal associated with a load powered by the tracking power supply;
controlling operation of a switching network according to the tracking signal, the switching network being electrically coupled between each of N power rails and a common tracking power rail powering the load, N being an integer greater than one, such that a voltage at the common tracking power rail is one of two or more values, as determined at least partially based on the tracking signal;
generating a voltage adjustment signal; and
adjusting a voltage value of at least one of the N power rails by feeding the generated voltage adjustment signal to the power conversion subsystem.

17. The method of claim 16, further comprising adjusting the voltage value of at least one of the N power rails according to a requirement of the load.

18. The method of claim 16, further comprising adjusting the voltage value of at least one of the N power rails according to an operating condition of the load.

19. The method of claim 16, further comprising adjusting the voltage value of at least one of the N power rails according to historical operating conditions of the load.

20. The method of claim 16, further comprising adjusting the voltage value of at least one of the N power rails according to a predicted required voltage of the load.

* * * * *